United States Patent
Ichikawa

(10) Patent No.: US 12,364,148 B2
(45) Date of Patent: Jul. 15, 2025

(54) DISPLAY DEVICE AND ELECTRONIC DEVICE

(71) Applicant: Sony Semiconductor Solutions Corporation, Kanagawa (JP)

(72) Inventor: Tomoyoshi Ichikawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 944 days.

(21) Appl. No.: 17/604,130

(22) PCT Filed: Apr. 24, 2020

(86) PCT No.: PCT/JP2020/017698
§ 371 (c)(1),
(2) Date: Oct. 15, 2021

(87) PCT Pub. No.: WO2020/241139
PCT Pub. Date: Dec. 3, 2020

(65) Prior Publication Data
US 2022/0223818 A1 Jul. 14, 2022

(30) Foreign Application Priority Data

May 31, 2019 (JP) .................................. 2019-102513

(51) Int. Cl.
*H10K 59/80* (2023.01)
*H10K 50/852* (2023.01)
(Continued)

(52) U.S. Cl.
CPC ......... *H10K 59/876* (2023.02); *H10K 50/852* (2023.02); *H10K 59/122* (2023.02);
(Continued)

(58) Field of Classification Search
CPC .... H10K 59/38; H10K 50/852; H10K 59/876; H10K 59/122; H10K 59/32; H01L 27/32; H05B 33/24
See application file for complete search history.

(56) References Cited

U.S. PATENT DOCUMENTS

2017/0179437 A1* 6/2017 Kim ........................ H10K 59/38
2018/0190740 A1* 7/2018 Bang .................... H10K 59/122

FOREIGN PATENT DOCUMENTS

| JP | 2013-065405 A | 4/2013 |
|---|---|---|
| JP | 2013-191533 A | 9/2013 |

(Continued)

OTHER PUBLICATIONS

International Search Report (PCT/ISA/210), International Application No. PCT/JP2020/017698, dated Jul. 10, 2020.

*Primary Examiner* — Dale E Page
*Assistant Examiner* — Abbigale A Boyle
(74) *Attorney, Agent, or Firm* — Michael Best & Friedrich LLP

(57) ABSTRACT

Display devices and electronic devices are disclosed. In one example, a display device includes lower electrodes arrayed in a matrix on a substrate; partition walls between adjacent ones of the lower electrodes; an organic layer formed by stacking material layers on an entire surface including upper surfaces of the lower electrodes and upper surfaces of the partition walls; and an upper electrode formed on an entire surface including an upper surface of the organic layer. In pixels with a light emitting unit in which the lower electrodes, the organic layer, and the upper electrode are stacked, light in a predetermined band is extracted to the outside by a resonator structure formed between the lower electrode and the upper electrode, and light in a band different from the predetermined band is extracted to the outside by total (Continued)

reflection at an interface between the organic layer and the partition wall.

20 Claims, 29 Drawing Sheets

(51) Int. Cl.
*H10K 59/122* (2023.01)
*H10K 59/32* (2023.01)
*H10K 59/38* (2023.01)
*H10K 102/10* (2023.01)

(52) U.S. Cl.
CPC ............. *H10K 59/32* (2023.02); *H10K 59/38* (2023.02); *H10K 2102/103* (2023.02)

(56) References Cited

FOREIGN PATENT DOCUMENTS

| | | |
|---|---|---|
| JP | 2017-117787 A | 6/2017 |
| JP | 2018-041565 A | 3/2018 |
| WO | 2015/141143 A1 | 9/2015 |
| WO | 2019/012987 A1 | 1/2019 |

* cited by examiner

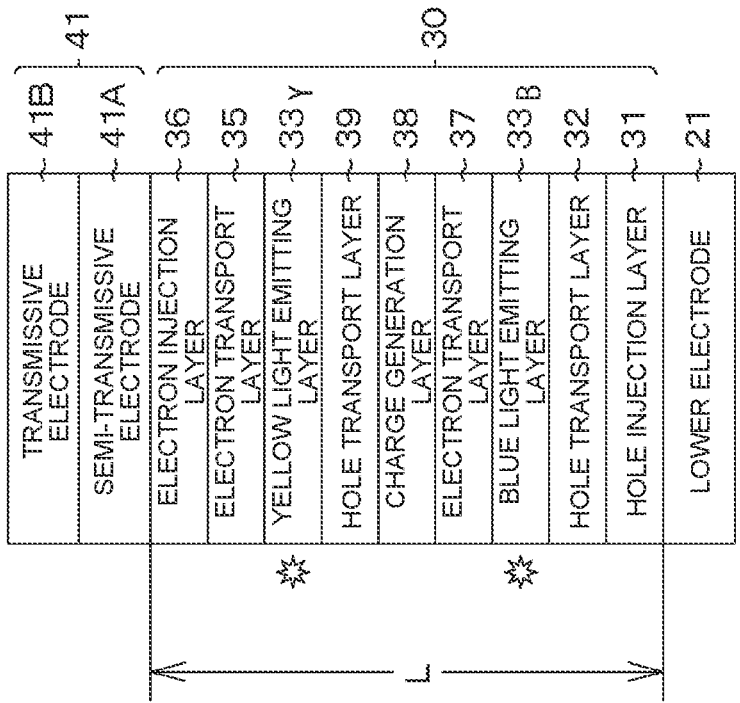
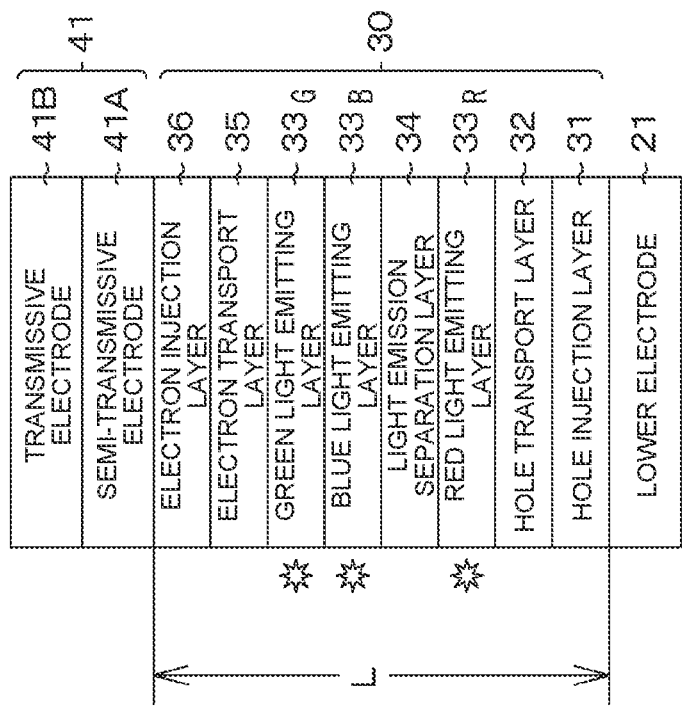

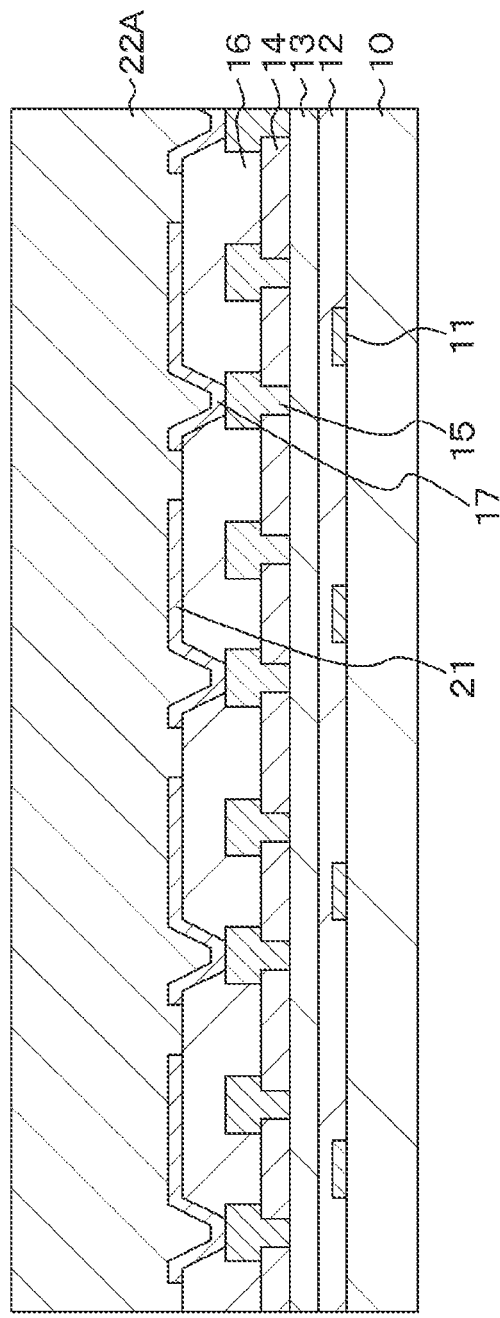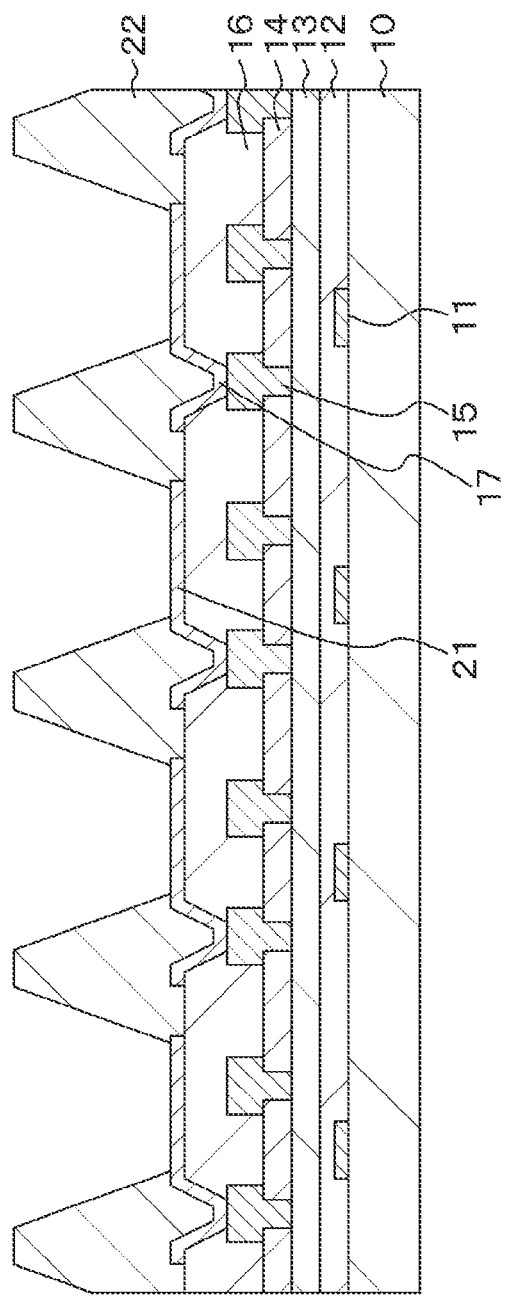

FIG. 10
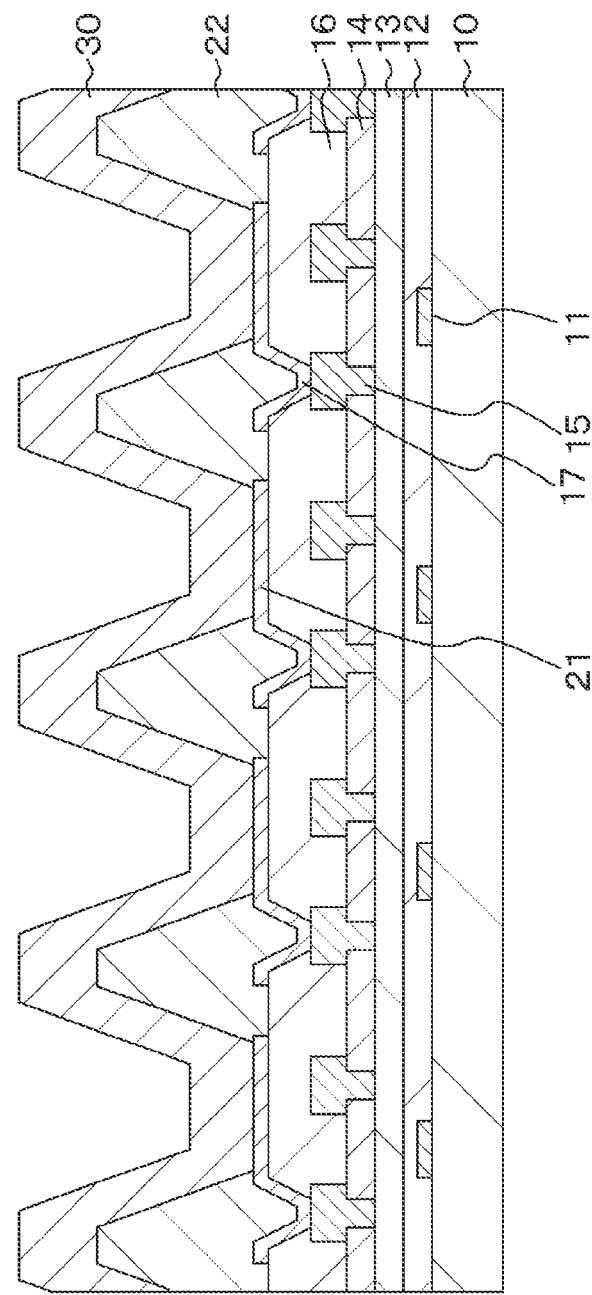

$2L/\lambda + \phi/2\pi = m$
FOR INTERMEDIATE WAVELENGTH $\lambda$
BETWEEN BLUE AND GREEN

FIG.21A

| | 70_R | 70_G | 70_B |
|---|---|---|---|
| 41 | UPPER ELECTRODE | | |
| | | UPPER ELECTRODE | |
| 30_R | ORGANIC LAYER | | UPPER ELECTRODE |
| | | 30_G ORGANIC LAYER | |
| 21 | LOWER ELECTRODE | | 30_B ORGANIC LAYER |
| | | LOWER ELECTRODE | |
| 72_R | OPTICAL ADJUSTMENT LAYER | | LOWER ELECTRODE |
| | | 72_G OPTICAL ADJUSTMENT LAYER | |
| | | | 72_B OPTICAL ADJUSTMENT LAYER |
| 71 | REFLECTION PLATE | REFLECTION PLATE | REFLECTION PLATE |

FIG.21B

| | 70_R | 70_G | 70_B |
|---|---|---|---|
| 41 | UPPER ELECTRODE | UPPER ELECTRODE | UPPER ELECTRODE |
| | 30_R ORGANIC LAYER | 30_G ORGANIC LAYER | 30_B ORGANIC LAYER |
| 21 | LOWER ELECTRODE | LOWER ELECTRODE | LOWER ELECTRODE |
| | 72_R OPTICAL ADJUSTMENT LAYER | 72_G OPTICAL ADJUSTMENT LAYER | 72_B OPTICAL ADJUSTMENT LAYER |
| | | | REFLECTION PLATE |
| 71 | REFLECTION PLATE | REFLECTION PLATE | 73 |

FIG.22A

| | $70_R$ | $70_G$ | $70_B$ |
|---|---|---|---|
| 41 | UPPER ELECTRODE | UPPER ELECTRODE | UPPER ELECTRODE |
| | $30_R$ ORGANIC LAYER | $30_G$ ORGANIC LAYER | $30_B$ ORGANIC LAYER |
| 21 | LOWER ELECTRODE | LOWER ELECTRODE | LOWER ELECTRODE |
| | $72_R$ OPTICAL ADJUSTMENT LAYER | $72_G$ OPTICAL ADJUSTMENT LAYER | $72_B$ OPTICAL ADJUSTMENT LAYER |
| | $71_R$ REFLECTION PLATE | $71_G$ REFLECTION PLATE | $71_B$ REFLECTION PLATE |

FIG.22B

| | $70_R$ | $70_G$ | $70_B$ |
|---|---|---|---|
| 41 | UPPER ELECTRODE | | |
| | $30_R$ ORGANIC LAYER | UPPER ELECTRODE | |
| | | $30_G$ ORGANIC LAYER | UPPER ELECTRODE |
| | $21_R$ LOWER ELECTRODE | | $30_B$ ORGANIC LAYER |
| | | $21_G$ LOWER ELECTRODE | $21_B$ LOWER ELECTRODE |
| 71 | REFLECTION PLATE | REFLECTION PLATE | REFLECTION PLATE |

FIG.23A

| | 70_R | 70_G | 70_B |
|---|---|---|---|
| 41 | UPPER ELECTRODE | UPPER ELECTRODE | UPPER ELECTRODE |
| | 30_R ORGANIC LAYER | 30_G ORGANIC LAYER | 30_B ORGANIC LAYER |
| 21 | LOWER ELECTRODE | LOWER ELECTRODE | LOWER ELECTRODE |
| | 74_R OXIDE FILM | 74_G OXIDE FILM | 74_B OXIDE FILM |
| | 71_R REFLECTION PLATE | 71_G REFLECTION PLATE | 71_B REFLECTION PLATE |

FIG.23B

| | 70_R | 70_G | 70_B |
|---|---|---|---|
| 41 | UPPER ELECTRODE | UPPER ELECTRODE | UPPER ELECTRODE |
| | 30_R ORGANIC LAYER | 30_G ORGANIC LAYER | 30_B ORGANIC LAYER |
| | 21_R LOWER ELECTRODE/ REFLECTION PLATE | 21_B LOWER ELECTRODE/ REFLECTION PLATE | 21_G LOWER ELECTRODE/ REFLECTION PLATE |

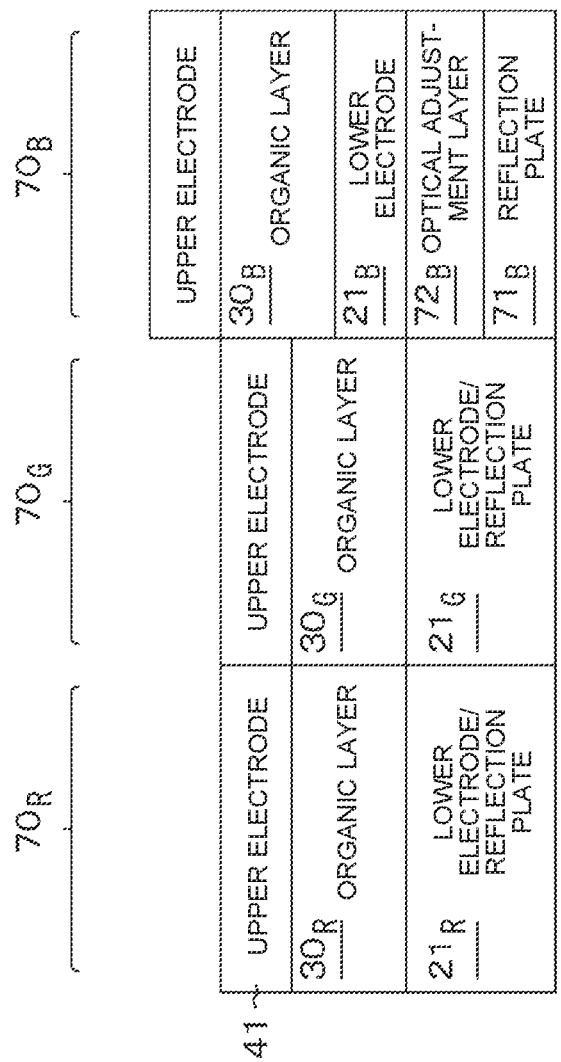

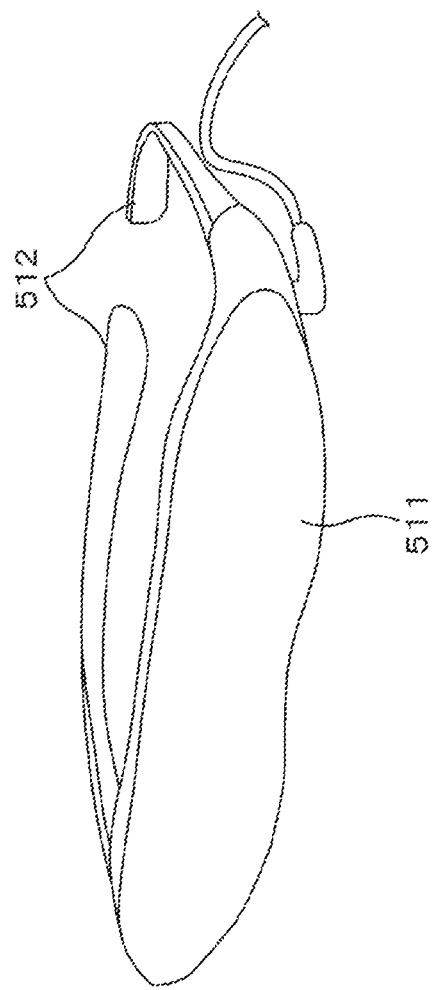

DISPLAY DEVICE AND ELECTRONIC DEVICE

FIELD

The present disclosure relates to a display device and an electronic device.

BACKGROUND

In recent years, as a display device replacing a liquid crystal display device, an organic electroluminescence (EL) display device using electroluminescence, which is an organic material, has been spotlighted. The organic EL display device is being applied to an ultra-small display requiring a fine pixel pitch of about several microns as well as a direct-view display such as a monitor.

In the organic EL display device, as a method of realizing color display, for example, there is a method in which a red light emitting layer, a green light emitting layer, or a blue light emitting layer is formed for each pixel using a mask. This method is mainly used for the direct-view display device. In addition, apart from the above-described method, there is a method in which a light emitting layer for emitting white light is formed in common in each pixel and a color filter is arranged for each pixel. The finer the pixel pitch is, the more difficult it is to form a light emitting layer for each pixel using a mask in terms of accuracy in alignment or the like. Therefore, in the organic EL display device having a fine pixel pitch of about several microns, it is suitable that an organic layer including a light emitting layer for emitting white light is formed in common in each pixel and a color filter is combined thereto.

However, in the method in which the organic layer including a white light emitting layer and the color filter are combined to each other, white light is color-separated by the color filter, resulting in a decrease in light emission efficiency. For this reason, there has been proposed a structure (reflector structure) in which light is reflected by partition walls separating pixels from one another to increase extraction efficiency (for example, see Patent Document 1).

CITATION LIST

Patent Literature

Patent Literature 1: JP 2013-191533 A

SUMMARY

Technical Problem

The organic layer generating white light usually includes a plurality of light emitting layers emitting different-color light from each other. For this reason, in order to achieve color balance, it is necessary to stack the light emitting layers after adjusting light emission characteristics of the respective light emitting layers. However, it is difficult to independently control the light emission characteristic for each light emitting layer. In particular, in the reflector structure, it is more difficult to achieve color balance because the light emission characteristic of the light emitting layer varies depending on the coating property of the organic layer.

Therefore, an object of the present disclosure is to provide a display device capable of easily achieving color balance while improving extraction efficiency by a so-called reflector structure, and an electronic device including the display device.

Solution to Problem

To solve the problems described above, a display device includes: lower electrodes formed to be arrayed in a two-dimensional matrix form on a substrate; partition walls each provided between adjacent ones of the lower electrodes and having a cross section whose width is smaller as being farther away from the substrate; an organic layer formed by stacking a plurality of material layers on an entire surface including upper surfaces of the lower electrodes and upper surfaces of the partition walls; and an upper electrode formed on an entire surface including an upper surface of the organic layer, wherein in pixels each including a light emitting unit in which the lower electrodes, the organic layer, and the upper electrode are stacked, light in a predetermined band is extracted to the outside by a resonator structure formed between the lower electrode and the upper electrode, and light in a band different from the predetermined band is extracted to the outside by total reflection at an interface between the organic layer and the partition wall.

To solve the problems described above, an electronic device including a display device is provided that includes: lower electrodes formed to be arrayed a two-dimensional matrix form on a substrate; partition walls each provided between adjacent ones of the lower electrodes and having a cross section whose width is smaller as being farther away from the substrate; an organic layer formed by stacking a plurality of material layers on an entire surface including upper surfaces of the lower electrodes and upper surfaces of the partition walls; and an upper electrode formed on an entire surface including an upper surface of the organic layer, in pixels each including a light emitting unit in which the lower electrodes, the organic layer, and the upper electrode are stacked, light in a predetermined band is extracted to the outside by a resonator structure formed between the lower electrode and the upper electrode, and light in a band different from the predetermined band is extracted to the outside by total reflection at an interface between the organic layer and the partition wall.

BRIEF DESCRIPTION OF DRAWINGS

FIG. 4A illustrates a configuration of an organic layer including a red light emitting layer, a blue light emitting layer, and a green light emitting layer.

FIG. 4B illustrates a configuration of an organic layer including a blue light emitting layer and a yellow light emitting layer.

FIGS. 9A and 9B are schematic partial cross-sectional views for explaining a method for manufacturing the display device according to the first embodiment.

FIG. 10 is a schematic partial cross-sectional view for explaining the method for manufacturing the display device according to the first embodiment, continuing from FIG. 9B.

FIG. 21A is a schematic cross-sectional view for explaining a first example of a resonator structure. FIG. 21B is a schematic cross-sectional view for explaining a second example of the resonator structure.

FIG. 22A is a schematic cross-sectional view for explaining a third example of the resonator structure. FIG. 22B is a schematic cross-sectional view for explaining a fourth example of the resonator structure.

FIG. 23A is a schematic cross-sectional view for explaining a fifth example of the resonator structure. FIG. 23B is a schematic cross-sectional view for explaining a sixth example of the resonator structure.

FIG. 24 is a schematic cross-sectional view for explaining a seventh example of the resonator structure.

FIG. 25 is an external view of a lens interchangeable single-lens reflex type digital camera.

FIG. 26 is an external view of a head mounted display.

DESCRIPTION OF EMBODIMENTS

Figure 1:
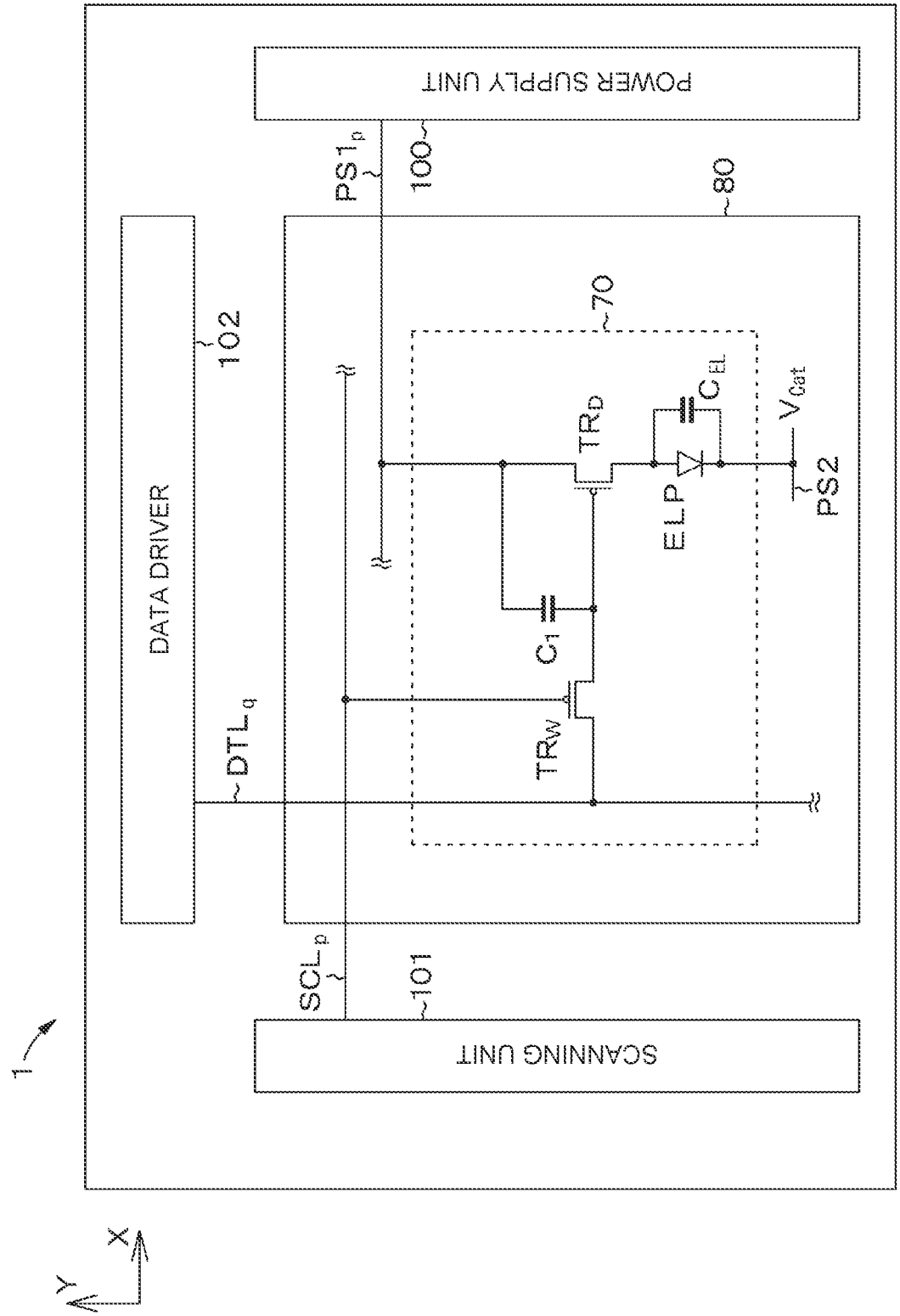
FIG. 1 is a conceptual diagram of a display device according to a first embodiment.

Hereinafter, the present disclosure will be described based on embodiments with reference to the drawings. The present disclosure is not limited to the embodiments, and various numerical values and materials in the embodiments are examples. In the following description, the same reference signs will be used for the same elements or elements having the same functions, and redundant description will be omitted. Note that the description will be given in the following order.

1. General Description of Display Device and Electronic Device of Present Disclosure
2. First Embodiment
3. Second Embodiment
4. Third Embodiment
5. Fourth Embodiment
6. Description of Electronic Device
7. Example of Resonator Structure Applied to Each Embodiment
8. Application Example
9. Configuration of Present Disclosure General Description of Display Device and Electronic Device of Present Disclosure As described above, a display device according to the present disclosure or a display device used in an electronic device according to the present disclosure (which may hereinafter be referred to as "the display device of the present disclosure") includes:

lower electrodes formed to be arrayed in a two-dimensional matrix form on a substrate;

partition walls each provided between adjacent ones of the lower electrodes and having a cross section whose width is smaller as being farther away from the substrate;

an organic layer formed by stacking a plurality of material layers on an entire surface including upper surfaces of the lower electrodes and upper surfaces of the partition walls; and an upper electrode formed on an entire surface including an upper surface of the organic layer, in which in pixels each including a light emitting unit in which the lower electrodes, the organic layer, and the upper electrode are stacked, light in a predetermined band is extracted to the outside by a resonator structure formed between the lower electrode and the upper electrode, and light in a band different from the predetermined band is extracted to the outside by total reflection at an interface between the organic layer and the partition wall. Note that the "band different from the predetermined band" includes not only a band that entirely does not overlap the "predetermined band" but also a band that partially overlaps the "predetermined band.

In the display device of the present disclosure, the upper electrode can be formed by stacking a semi-transmissive electrode and a transmissive electrode. Note that the semi-transmissive electrode may be disposed on the organic layer side, or the transmissive electrode may be disposed on the organic layer side. In this case, a film thickness ratio of the semi-transmissive electrode in the upper electrode can be relatively lower in a portion located above an inclined surface of the partition wall than in a portion located above the lower electrode.

The semi-transmissive electrode can be formed using a metal such as calcium (Ca), barium (Ba), lithium (Li), cesium (Cs), indium (In), magnesium (Mg), silver (Ag), an alloy thereof, or the like. More preferably, the semi-transmissive electrode is made of a magnesium-silver alloy (MgAg), silver (Ag), or calcium (Ca). The transmissive electrode can be made of indium zinc oxide (IZO) or indium tin oxide (ITO). In terms of suppression for reduction in film formation temperature, the transmissive electrode is preferably formed using IZO. In addition, the semi-transmissive electrode can be formed by a vapor deposition method, and the transmissive electrode can be formed by a sputtering method. The upper electrode formed by stacking the semi-transmissive electrode and the transmissive electrode is provided as a common continuous film on the organic layer.

In the display device of the present disclosure including the various preferable configurations described above, the organic layer can include a plurality of light emitting layers emitting different-color light from each other.

In this case, the organic layer can include a red light emitting layer, a blue light emitting layer, and a green light emitting layer. In this case, the organic layer emits white light as a whole by additive color mixing of the three primary colors of light. In addition, a light emission separation layer can be disposed between the red light emitting layer and the blue light emitting layer. In this case, a film thickness ratio of the light emission separation layer in the organic layer can be relatively lower in a portion located above an inclined surface of the partition wall than in a portion located above the lower electrode.

Alternatively, the organic layer can include a blue light emitting layer and a yellow light emitting layer. In this case, the organic layer emits white light as a whole by additive color mixing of blue light and yellow light.

In the display device of the present disclosure including the various preferable configurations described above, the inclined surface of the partition wall may be formed to be uniformly inclined. Alternatively, the inclined surface of the partition wall may be formed in a stepwise manner to be gently inclined on a lower electrode side thereof. The former configuration is preferable in simplifying a process of forming the partition walls, and the latter configuration is preferable in terms of the film forming properties of the organic layer and the like formed on the partition walls.

In the display device of the present disclosure including the various preferable configurations described above, color filters corresponding to colors to be displayed can be disposed on upper surfaces of the pixels, respectively. In this case, as shapes of the light emitting regions of the pixels observed through the color filters, a circular shape and an annular shape are mixed.

In the display device of the present disclosure including the various preferable configurations described above, in the resonator structure formed between the lower electrode and the upper electrode, when a phase shift of reflected light generated between the lower electrode and the upper electrode is denoted by reference sign $\Phi$, an optical distance between the lower electrode and the upper electrode is denoted by reference sign L, and a center wavelength of a predetermined band is denoted by reference sign $\lambda$, the optical distance L can satisfy the following condition:

$$2L/\lambda + \Phi/2\pi = m \text{ where, } m \text{ is an integer.}$$

In the display device of the present disclosure including the various preferable configurations described above, light having a blue light wavelength as a center wavelength of a band can be extracted to the outside by the resonator structure formed between the lower electrode and the upper electrode. In this case, yellow light can be extracted to the outside by the total reflection at the interface between the organic layer and the partition wall.

Alternatively, in the display device of the present disclosure including the various preferable configurations described above, light having an intermediate wavelength between a blue light wavelength and a green light wavelength as a center wavelength of a band can be extracted to the outside by the resonator structure formed between the lower electrode and the upper electrode. Each of the wavelengths for the light emitting layers of the organic layer has a certain width for each light-emission color. The wavelength of the light extracted by resonance also has a certain width. Therefore, when the resonance condition of the resonator structure is set to the intermediate wavelength between the blue light wavelength and the green light wavelength, light ranging from the blue light wavelength to the green light wavelength is extracted. In this case, red light can be extracted to the outside by the total reflection at the interface between the organic layer and the partition wall.

Note that, depending on the setting of the resonator structure, the center wavelength may be an intermediate wavelength between a red light wavelength and a green light wavelength, the red light wavelength, or the green light wavelength. When the center wavelength is the intermediate wavelength between the red light wavelength and the green light wavelength, light (yellow light) ranging from the red light wavelength to the green light wavelength is extracted by the resonator structure, and blue light is extracted by the total reflection at the interface between the organic layer and the partition wall. When the center wavelength is the red light wavelength, red light is extracted by the resonator structure, and blue light and green light are extracted by the total reflection at the interface between the organic layer and the partition wall. When the center wavelength is the green light wavelength, green light is extracted by the resonator structure, and blue light and red light are extracted by the total reflection at the interface between the organic layer and the partition wall. In addition, when the center wavelength includes both the blue light wavelength and the red light wavelength, blue light and red light are extracted by the resonator structure, and green light is extracted by the total reflection at the interface between the organic layer and the partition wall.

In the display device of the present disclosure, the substrate can include drive circuits for driving the pixels, and the lower electrodes and the drive circuits can be electrically connected to each other. The lower electrodes and the drive circuits can be connected to each other, for example, through conducting portions including vias or the like provided in an interlayer insulating film.

As a material constituting the substrate, a semiconductor material, a glass material, or a plastic material can be exemplified. In a case where the drive circuit is configured by transistors formed on the semiconductor substrate, well regions may be provided on the semiconductor substrate made of, for example, silicon, and the transistors may be formed in the wells. On the other hand, in a case where the drive circuit is configured by thin film transistors or the like, the drive circuit can be formed by forming semiconductor thin films on the substrate made of a glass material or a plastic material. Various wirings can have known configurations and structures.

In the display device of the present disclosure, the configuration of the drive circuit or the like controlling the light emission of the light emitting unit is not particularly limited. The light emitting unit can be disposed above the drive circuit formed, for example, in a certain plane of the substrate, and driving the light emitting unit, for example, via the interlayer insulating layer. The configuration of the transistors constituting the drive circuit is not particularly limited. The transistors may be p-channel field effect transistors, or may be n-channel field effect transistors.

In the display device of the present disclosure, the light emitting units can be configured in a so-called top emission type. The light emitting units are formed by sandwiching an organic layer including a hole transport layer, a light emitting layer, an electron transport layer, and the like between the lower electrodes and the upper electrode. When a cathode is shared in common, the upper electrode serves as a cathode electrode, and the lower electrodes serve as anode electrodes.

The lower electrodes are provided on the substrate for the respective light emitting units. When a cathode is shared in common, the lower electrodes serve as anode electrodes of the light emitting units, respectively. The lower electrodes can be made using a metal such as aluminum (Al), an aluminum alloy, platinum (Pt), gold (Au), chromium (Cr), or tungsten (W), an alloy thereof, or the like. Alternatively, the lower electrodes may be formed by stacking a transparent conductive material layer, such as indium tin oxide (ITO) or indium zinc oxide (IZO), and a reflective layer made of a light reflective material. The lower electrodes preferably have a thickness set in a range of 100 to 300 nanometers.

The partition walls can be formed using a material appropriately selected from known inorganic and organic materials, and can be formed, for example, by combining a known film forming method, such as a physical vapor deposition method (PVD method) exemplified by a vacuum vapor deposition method or a sputtering method or any type of chemical vapor deposition method (CVD method), and a known patterning method, such as an etching method or a lift-off method.

The organic layer is formed by stacking a plurality of material layers, and is provided as a common continuous film on an entire surface including upper surfaces of the lower electrodes and upper surfaces of the partition walls. The organic layer emits light by applying a voltage between the lower electrode and the upper electrode. The organic layer can have, for example, a structure in which a hole injection layer, a hole transport layer, a light emitting layer, an electron transport layer, and an electron injection layer are stacked in order on the lower electrode side. A hole transport material, a hole transport material, an electron transport material, and an organic light emitting material constituting the organic layer are not particularly limited, and known materials can be used therefor.

The organic layer may have a structure in which a plurality of light emitting layers are stacked. For example, light emitting units each emitting white light can be formed by stacking a red light emitting layer, a blue light emitting layer, and a green light emitting layer, or by stacking a blue light emitting layer and a yellow light emitting layer.

The display device of the present disclosure can be configured to display colors. In the case of the color display, a color filter can be formed using, for example, a resin material containing a pigment or a dye. Note that a so-called monochrome display configuration may be employed if necessary.

In the case of the color display configuration, one pixel can include a plurality, of sub-pixels. Specifically, one pixel can include three sub-pixels, i.e. a red display sub-pixel, a green display sub-pixel, and a blue display sub-pixel. Furthermore, one or more types of sub pixels can be added to these three types of sub-pixels for a set of sub-pixels (for example, a set further including a sub-pixel that emits white light to improve luminance, a set further including a sub-pixel that emits complementary color to expand a color reproduction range, a set further including a sub-pixel that emits yellow to expand a color reproduction range, or a set further including sub-pixels that emit yellow and cyan, respectively, to expand a color reproduction range).

As pixel values of the display device, some resolutions for image display can be exemplified, such as VGA(640,480), S-VGA(800,600), XGA(1024,768), APRC(1152,900), S-XGA(1280,1024), U-XGA(1600,1200), HD-TV(1920, 1080) Q-XGA(2048,1536), (1920,1035), (720,480), and (1280,960), but the values are not limited thereto.

Examples of the electronic device including the display device of the present disclosure include various electronic devices each having an image display function, as well as direct-view type and projection type display devices.

Conditions indicated by various formulae in the present specification are satisfied not only when the formulae are mathematically strictly established but also when the formulae are substantially established. With respect to the establishment of the formulae, the presence of various variations caused in a process of designing or manufacturing the display device is allowed. In addition, the drawings used in the following description are schematic. For example, FIG. 2, which will be described later, illustrates a cross-sectional structure of the display device, but does not illustrate ratios concerning width, height, thickness, and the like.

First Embodiment

A first embodiment relates to a display device according to a first aspect of the present disclosure.

FIG. 1 is a schematic plan view of a display device according to a first embodiment of the present disclosure. A display device 1 includes: a display region 80 in which pixels 70, each including a light emitting unit ELP and a drive circuit driving the light emitting unit ELP while being connected to a scanning line SCL extending in a row direction (X direction in FIG. 1) and a data line DTL extending in a column direction (Y direction in FIG. 1), are arrayed in a two-dimensional matrix form; a power supply unit 100 supplying a voltage to a feeder line PS1; a scanning unit 101 supplying a scanning signal to the scanning line SCL; and a data driver 102 supplying a signal voltage to the data line DTL. Note that, for convenience of illustration, FIG. 1 illustrates a connection relationship for one pixel 70, more specifically, a (q,p)-th pixel 70, which will be described later.

The display device 1 further includes a common feeder line PS2 commonly connected to all pixels 70. A predetermined drive voltage is supplied to the feeder line PS1 from the power supply unit 100, and a common voltage (for example, a ground potential) is supplied to the common feeder line PS2.

Although not illustrated in FIG. 1, in the display region 80, Q pixels in the row direction and P pixels in the column direction, that is, a total of Q×P pixels (display elements) 70, are arrayed in the two-dimensional matrix form. The number of rows of pixels 70 in the display region is P, and the number of pixels 70 constituting each row is Q.

Each of the number of scanning lines SCL and the number of feeder lines PS1 is P. The pixels 70 in a p-th row (where p is 1, 2 . . . , or P) are connected to a p-th scanning line $SCL_p$ and a p-th feeder line $PS1_p$, and form one display element row. Note that only the scanning line $SCL_p$ and the feeder line $PS1_p$ are illustrated in FIG. 1.

The number of data lines DTL is Q. The pixels 70 in a q-th column (where q is 1, 2 ..., or Q) are connected to a q-th data line $DTL_q$. Note that only the data line $DTL_q$ is illustrated in FIG. 1.

The display device 1 is a display device, for example, for displaying colors. One pixel 70 constitutes one sub-pixel. The display device 1 is line-sequentially scanned row by row according to a scanning signal from the scanning unit 101. A pixel 70 located in a p-th row and in a q-th column will hereinafter be referred to as (q,p)-th pixel 70 or (q,p)-th pixel 70.

In the display device 1, Q pixels 70 arrayed in the p-th row are simultaneously driven. In other words, concerning the Q pixels 70 arranged in the row direction, their light emission/non-light emission timings are controlled row by row on the basis of the rows to which they belong. When a display frame rate of the display device 1 is expressed as FR (times/second), a scanning period per row (a so-called horizontal scanning period) at the time of line sequentially scanning the display device 1 row by row is less than $(1/FR) \times (1/P)$ seconds.

The pixel 70 includes a light emitting unit ELP and a drive circuit driving the light emitting unit ELP. The light emitting unit ELP includes an organic electroluminescence light emitting unit. The drive circuit includes a writing transistor $TR_W$, a driving transistor $TR_D$, and a capacitor $C_1$. When a current flows through the light emitting unit ELP via the driving transistor $TR_D$, the light emitting unit ELP emits light. Each transistor includes a p-channel field effect transistor.

In the pixel 70, a source/drain region on one side of the driving transistor $TR_D$ is connected to one end of the capacitor $C_1$ and the feeder line PS1, and a source/drain region on the other side of the driving transistor $TR_D$ is connected to one end (specifically, an anode electrode) of the light emitting unit ELP. A gate electrode of the driving transistor $TR_D$ is connected to a source/drain region on the other side of the writing transistor $TR_W$ and is also connected to the other end of the capacitor $C_1$.

Furthermore, in the writing transistor $TR_W$, a source/drain region on one side thereof is connected to the data line DTL, and a gate electrode thereof is connected to the scanning line SCL.

The other end (specifically, a cathode electrode) of the light emitting unit ELP is connected to the common feeder line PS2. A predetermined cathode voltage $V_{Cat}$ is supplied to the common feeder line PS2. Note that a capacitance of the light emitting unit ELP is denoted by reference sign $C_{EL}$.

An outline of driving of the pixel 70 will be described. In a state where a voltage corresponding to a luminance of an image to be displayed has been supplied from the data driver 102 to the data line DTL, when the writing transistor $TR_W$ becomes a conductive state according to a scanning signal from the scanning unit 101, the voltage corresponding to the luminance of the image to be displayed is written in the capacitor $C_1$. After the writing transistor $TR_W$ becomes a non-conductive state, a current flows through the driving transistor $TR_D$ according to the voltage maintained in the capacitor $C_1$, so that the light emitting unit ELP emits light.

Note that, in the present disclosure, the configuration of the drive circuit controlling the light emission of the pixel 70 is not particularly limited. Therefore, the configuration illustrated in FIG. 1 is merely an example, and the display device according to the present disclosure can take various configurations.

Next, a detailed structure of the display device 1 will be described.

Figure 2:
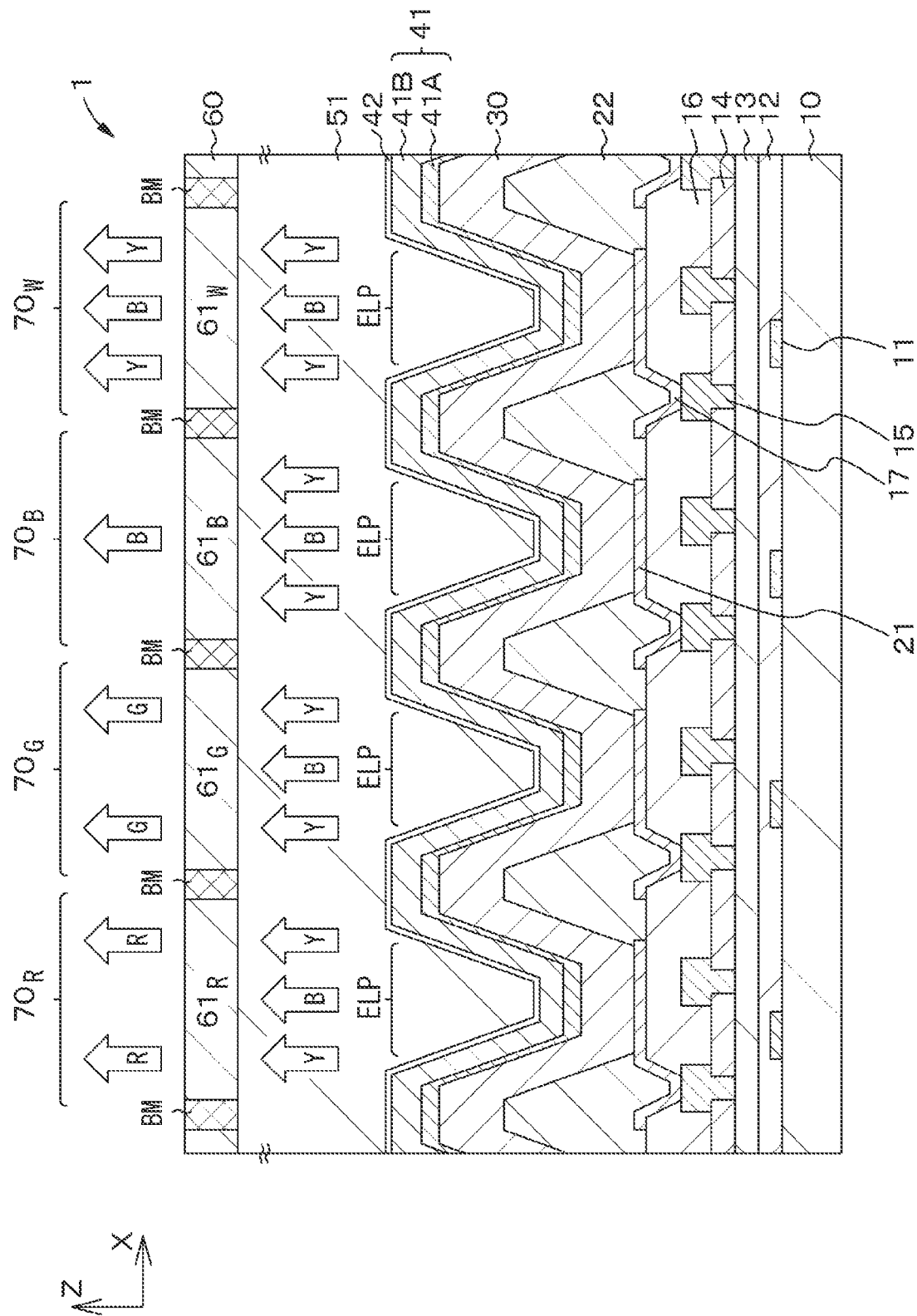
FIG. 2 is a schematic partial cross-sectional view of the display device.

FIG. 2 is a schematic partial cross-sectional view of the display device according to the first embodiment.

The display device 1 includes:
lower electrodes 21 formed to be arrayed in a two-dimensional matrix form on a substrate 10;
partition walls 22 each provided between adjacent ones of the lower electrodes 21 and having a cross section whose width is smaller as being farther away from the substrate 10;
an organic layer 30 formed by stacking a plurality of material layers on an entire surface including upper surfaces of the lower electrodes 21 and upper surfaces of the partition walls 22; and
an upper electrode 41 formed on an entire surface including an upper surface of the organic layer 30.

In the pixels of the display device 1, each including the light emitting unit ELP in which the lower electrodes 21, the organic layer 30, and the upper electrode 41 are stacked,
light in a predetermined band is extracted to the outside by a resonator structure formed between the lower electrode 21 and the upper electrode 41, and
light in a band different from the predetermined band is extracted to the outside by total reflection at an interface between the organic layer 30 and the partition wall 22. Note that the extraction of the light will be described in detail later with reference to FIGS. 3, 4, and 5 to be described later.

In the display device 1, the light emitting unit ELP is formed by stacking the lower electrode 21, the organic layer 30, and the upper electrode 41. The lower electrode 21 is provided for each light emitting unit ELP, and the partition wall 22 is formed between adjacent ones of the lower electrodes 21. The partition wall 22 functions as an insulating film between pixels. Note that the partition wall 22 is formed using a material having a higher refractive index than that constituting the organic layer 30.

The organic layer 30 and the upper electrode 41 are stacked on the entire surface including the upper surfaces of the lower electrodes 21 and the upper surfaces of the partition walls 22. The organic layer 30 includes a plurality of light emitting layers emitting different-color light from each other. The upper electrode 41 is formed by stacking a semi-transmissive electrode 41A and a transmissive electrode 41B. The display device 1 will be described as having a configuration in which the semi-transmissive electrode 41A is disposed on the organic layer 30 side, but the transmissive electrode 41B may be disposed on the organic layer 30 side.

A protective film 42 is formed on the transmissive electrode 41B. The protective film 42 serves to prevent penetration of moisture into the organic layer 30, and is formed of a material having low water-permeability. A high refractive index material layer 51 is provided on the upper electrode 41 (more specifically, on the protective film 42).

A color filter 60 corresponding to a color to be displayed is disposed on an upper surface of the pixel, in other words, above an upper surface of the light emitting unit ELP. The color filter 60 is provided, for example, on a counter substrate, which is not illustrated, and is bonded onto the high refractive index material layer 51. In the color filter 60, red, green, blue, and white (transparent) color filter portions are denoted by reference signs $61_R$, $61_G$, $61_B$, and $61_W$, respectively. In addition, so-called black matrix portions are denoted by reference sign BM.

Hereinafter, various components will be described in detail with reference to FIG. 2.

The substrate 10 is made of, for example, a glass material, a semiconductor material, a plastic material, or the like. The drive circuits, each including thin film transistors controlling the light emission of the light emitting unit ELP, are formed on the substrate 10.

On the substrate 10, gate electrodes 11, a gate insulating film 12 formed to cover an entire surface including upper surfaces of the gate electrodes 11, a semiconductor material layer 13, a planarizing film 14 formed to cover an entire surface including an upper surface of the semiconductor material layer 13, source/drain electrodes 15 connected to source/drain regions of transistors formed in the semiconductor material layer 13, a planarizing film 16 formed to cover an entire surface including upper surfaces of the source/drain electrodes 15, and lower electrodes 21 provided on the planarizing film 16 are formed.

The substrate 10 includes drive circuits including the above-described transistors and the like for driving the pixels 70. The lower electrodes 21 are connected to the source/drain electrodes 15 of the driving transistors via contact plugs 17 provided in openings of the planarizing film 16.

The gate electrodes 11 of the various transistors constituting the drive circuits can be formed using, for example, a metal such as aluminum (Al), polysilicon, or the like. The gate insulating film 12 is provided on the entire surface of the substrate 10 to cover the gate electrodes 11. The gate insulating film 12 can be formed using, for example, silicon oxide ($SiO_x$), silicon nitride ($SiN_x$), or the like.

The semiconductor material layer 13 can be formed on the gate insulating film 12 using, for example, amorphous silicon, polycrystalline silicon, an oxide semiconductor, or the like. In addition, some regions of the semiconductor material layer 13 are doped with impurities to form source/drain regions. Further, regions of the semiconductor material layer 13, each located between a source/drain region on one side and a source/drain region on the other side and located above the gate electrode 11, form channel regions. Accordingly, bottom gate-type thin film transistors are provided on the substrate 10. Note that illustration of the source/drain regions and the channel regions is omitted in FIG. 2.

The planarizing film 14 is provided on the semiconductor material layer 13. The planarizing film 14 is formed of, for example, silicon oxide ($SiO_x$), silicon nitride ($SiN_x$), silicon oxynitride ($SiO_xN_y$), or the like. The source/drain electrodes 15 are connected to the semiconductor material layer 13 via contact holes provided in the planarizing film 14. The source/drain electrodes 15 are formed of, for example, a metal such as aluminum (Al).

The planarizing film 16 is formed to cover the drive circuits and the like for planarization. The planarizing film 16 can be formed using, for example, an organic insulating film such as a polyimide-based resin, an acryl-based resin, or a novolac-based resin, or an inorganic insulating film such as silicon oxide ($SiO_x$), silicon nitride ($SiN_x$), or silicon oxynitride ($SiO_xN_y$). The contact plugs 17 are made of, for example, a metal material such as copper (Cu) or a copper alloy, and are formed in the openings provided in the planarizing film 16.

The lower electrodes 21 are made of, for example, for example, an aluminum-copper alloy (AlCu), and are provided each for the light emitting unit ELP. The partition walls 22 are formed each between adjacent ones of the lower electrodes 21.

The partition walls 22 can be formed by, for example, subjecting a material layer made of an inorganic material such as silicon oxynitride ($SiO_xN_y$) to an etching treatment to provide openings such that each of the partition walls 22 has a cross section whose width is smaller as being farther away from the substrate 10. Specifically, truncated cone-shaped openings each having a peak on the substrate 10 side are provided. Therefore, an inclined surface of the partition wall 22 is formed to be uniformly inclined. Since the partition wall 22 has a larger refractive index than the organic layer 30, light incident on the inclined surface of the partition wall 22 beyond a critical angle is totally reflected.

The organic layer 30 is formed on the entire surface including the upper surfaces of the lower electrodes 21 and the upper surfaces of the partition walls 22. The organic layer 30 includes a red light emitting layer, a blue light emitting layer, and a green light emitting layer, and is configured to emit white light as a whole. The organic layer 30 can have, for example, a structure in which a hole injection layer, a hole transport layer, a red light emitting layer, a light emission separation layer, a blue light emitting layer, a green light emitting layer, an electron transport layer, and an electron injection layer, which are made of an organic material, are sequentially stacked. For convenience of illustration, the organic layer 30 is illustrated as one layer. A film thickness, a stack relationship, and the like of the organic layer 30 will be described in detail later with reference to FIG. 5, which will be described later.

The upper electrode 41 is formed on the entire surface including the upper surface of the organic layer 30. As described above, the upper electrode 41 includes the semi-transmissive electrode 41A located on the organic layer 30 side and the transmissive electrode 41B formed on the semi-transmissive electrode 41A. The upper electrode 41 is made of a laminate film of a material having a small work function with good light transmission. The semi-transmissive electrode 41A can be made of a magnesium-silver alloy (MgAg), silver (Ag), calcium (Ca), or the like. The transmissive electrode 41B can be made of indium zinc oxide (IZO) or indium tin oxide (ITO). The semi-transmissive electrode 41A is formed by a vapor deposition method, and the transmissive electrode is formed by a sputtering method.

A protective film 42 is formed on the transmissive electrode 41B. The protective film 42 is provided to prevent penetration of moisture into the organic layer 30, and is formed of a material having low water permeability. A thickness thereof is, for example, about 0.5 to 8 micrometers. The protective film 42 can be formed using a material such as silicon nitride ($SiN_x$), silicon oxide ($SiO_x$), aluminum oxide ($AlO_x$), titanium oxide ($Ti_x$), or a combination thereof.

A high refractive index material layer 51 is provided on the upper electrode 41 (more specifically, on the protective film 42). The high refractive index material layer 51 can be made of $Si_{1-x}N_x$, ITO, IZO, $TiO_2$, $Nb_2O_5$, a bromine-containing polymer, a sulfur-containing polymer, a titanium-containing polymer, a zirconium-containing polymer, or the like. Note that, when there is no problem, the high refractive index material layer 51 may also serve as a protective film.

A color filter 60 corresponding to a color to be displayed is disposed on an upper surface of the pixel, in other words, above an upper surface of the light emitting unit ELP. Light generated from the organic layer 30 is extracted after being color-divided by the color filter 60. In addition, since external light reflected by internal wiring is absorbed, contrast is also improved.

The various components have been described in detail above. Next, extraction of light from the light emitting unit ELP will be described.

Figure 3:
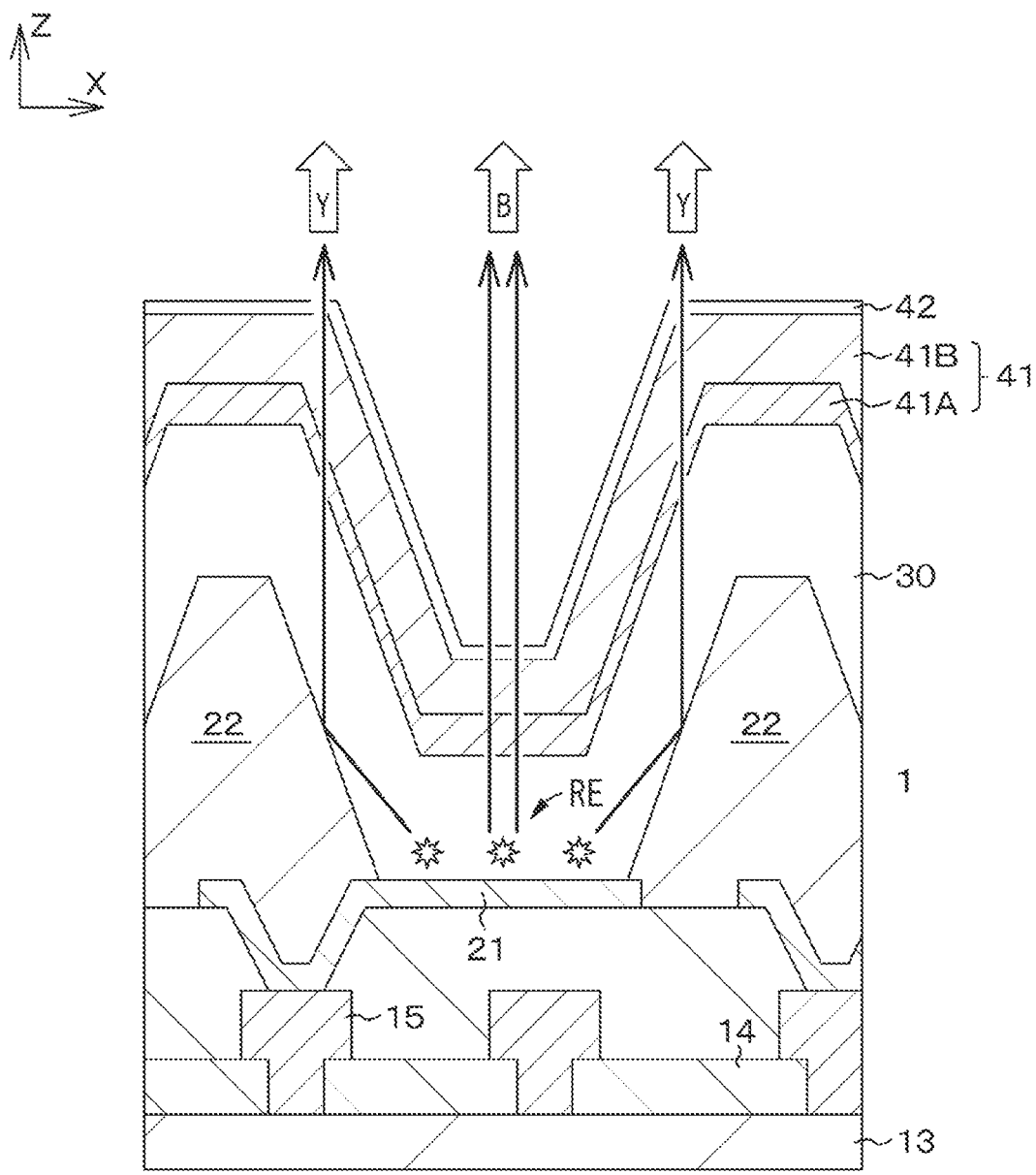
FIG. 3 is a schematic partial cross-sectional view for explaining extraction of light from a pixel.

FIG. 3 is a schematic partial cross-sectional view for explaining extraction of light from a pixel. Note that, for convenience of illustration, hatching in the organic layer is omitted. The same applies to other drawings that will be described later.

A portion between the lower electrode 21 and the upper electrode 41 (denoted by reference sign RE in the drawing) is configured to satisfy a resonance condition with a predetermined wavelength as a center wavelength of a band. More specifically, light in a band having a blue light wavelength as a center wavelength is extracted to the outside by a resonator structure formed between the lower electrode 21 and the upper electrode 41. In addition, yellow light (including a green light component and a red light component) is extracted to the outside by total reflection at an interface between the organic layer 30 and the partition wall 22.

The resonator structure formed between the lower electrode 21 and the upper electrode 41 will be described. FIG. 4A illustrates a configuration of an organic layer including a red light emitting layer, a blue light emitting layer, and a green light emitting layer.

As illustrated in the drawing, the organic layer 30 is formed by stacking, on the lower electrode 21 side, a hole injection layer 31, a hole transport layer 32, a red light emitting layer $33_R$, a light emission separation layer 34, a blue light emitting layer $33_B$, a green light emitting layer $33_G$, an electron transport layer 35, and an electron injection layer 36. A thickness of each layer is preferably set in a range of, for example, 1 to 20 nanometers for the hole injection layer, 10 to 200 nanometers for the hole transport layer, 5 to 50 nanometers for each light emitting layer, and 10 to 200 nanometers for the electron transport layer and the electron injection layer. The semi-transmissive electrode 41A is set in a range of 3 to 20 nanometers, and the transmissive electrode 41B is set in a range of 10 to 200 nanometers. More specifically, the thickness of each layer is set to satisfy the following condition.

In the resonator structure formed between the lower electrode 21 and the upper electrode 41, when a phase shift of reflected light generated between the lower electrode 21 and the upper electrode 41 (more specifically, the semi-transmissive electrode 41A) is denoted by reference sign Φ, an optical distance between the lower electrode 21 and the upper electrode 41 (more specifically, the semi-transmissive electrode 41A) is denoted by reference sign L, and a center wavelength of a predetermined band is denoted by reference sign λ, the thickness of each layer is set such that the optical distance L illustrated in FIG. 4A satisfies the following condition:

$$2L/\lambda + \Phi/2\pi = m \text{ where, } m \text{ is an integer.}$$

When the film thickness is set to satisfy a resonance condition for the blue light wavelength in a flat area of the pixel, blue light is extracted by a microcavity effect, and green light and red light are extracted by using reflection at the interface of the partition wall. Since a blue light emitting region and a yellow light emitting region are juxtaposed with each other, they can be treated as emission of white light as a whole.

Note that the organic layer 30 may include a blue light emitting layer and a yellow light emitting layer. FIG. 4B illustrates a configuration of an organic layer including a blue light emitting layer and a yellow light emitting layer. In this case as well, the thickness of each layer may be set such that an optical distance L illustrated in FIG. 4B satisfies the above-described condition. In addition, in a case where the transmissive electrode 41B is disposed on the organic layer 30 side in the configuration illustrated in FIG. 4A or 4B, the optical distance L may be set in a state where the transmissive electrode 41B is included therein.

In addition, in the display device 1, a film thickness ratio of the semi-transmissive electrode 41A in the upper electrode 41 is relatively lower in a portion located above the inclined surface of the partition wall 22 than in a portion located above the lower electrode 21.

Figure 5:
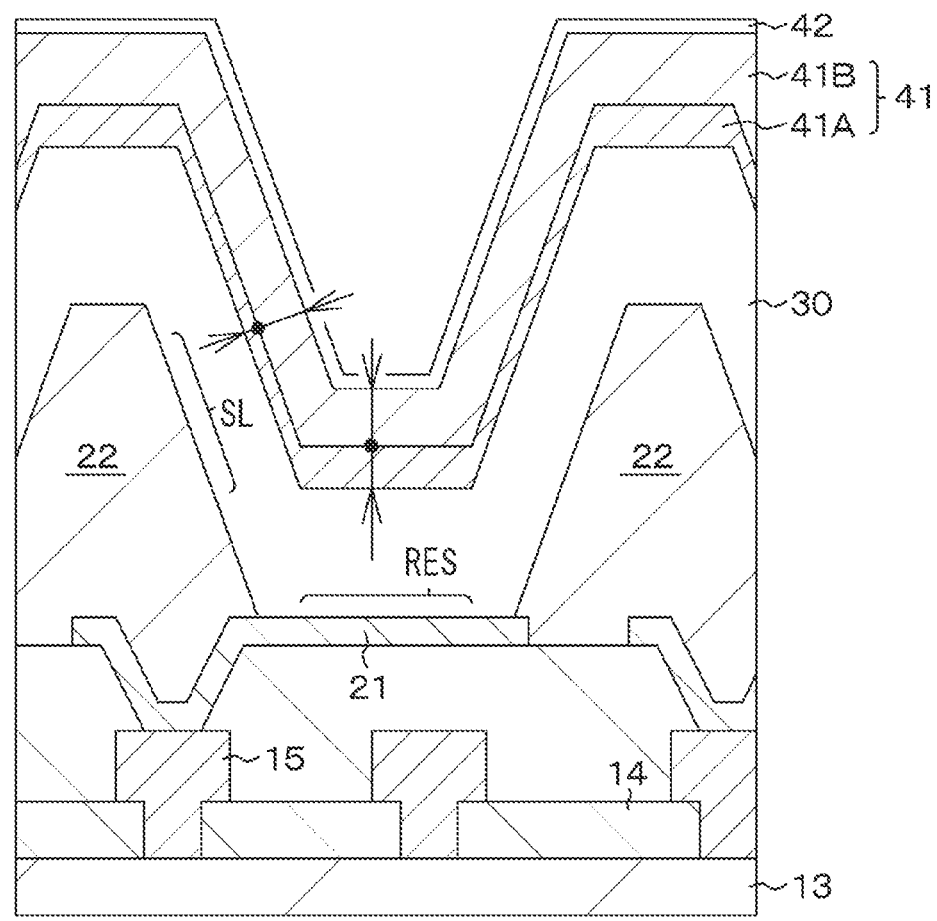
FIG. 5 is a schematic partial cross-sectional view for explaining a film thickness ratio of a semi-transmissive electrode in the pixel.

FIG. 5 is a schematic partial cross-sectional view for explaining the film thickness ratio of the semi-transmissive electrode in the pixel.

Taking into account that the light totally reflected by the inclined surface of the partition wall 22 is extracted to the outside, it is preferable that the semi-transmissive electrode 41A is as thin as possible in a portion that is not involved in the resonator structure. When film thicknesses of the semi-transmissive electrode 41A and the transmissive electrode 41B on the inclined surface of the partition wall 22 (denoted by reference sign SL) are denoted by reference signs $T_1$ and $T_2$, respectively, and film thicknesses of the semi-transmissive electrode 41A and the transmissive electrode 41B on a flat area of the lower electrode 21 (denoted by reference sign RES) are denoted by reference signs $T_3$ and $T_4$, respectively, the semi-transmissive electrode 41A and the transmissive electrode 41B are configured to satisfy the following relationship:

$$T_1/(T_1+T_2) < T_3/(T_3+T_4).$$

The extraction of light from the light emitting unit ELP has been described above. Next, arrangement of light emitting units ELP, arrangement of color filters, and light emitting regions of pixels observed through the color filters in the display region will be described with reference to the drawings.

Figure 6:
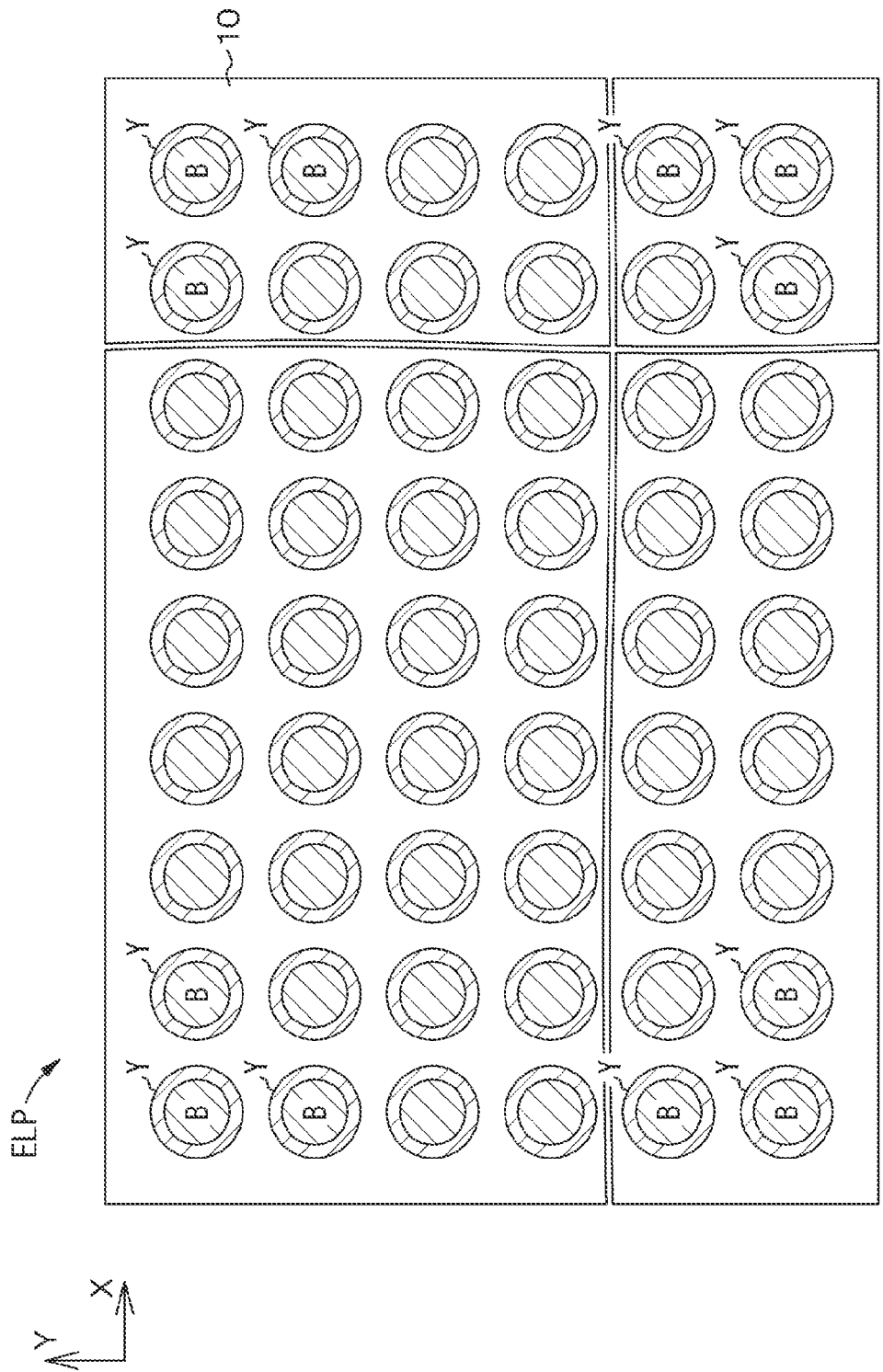
FIG. 6 is a schematic plan view for explaining an arrangement relationship between light emitting units in the display device.

FIG. 6 is a schematic plan view for explaining an arrangement relationship between light emitting units in the display device.

In the light emitting regions of the display device 1, the light emitting units ELP having the above-described structure are arrayed in a two-dimensional matrix form. Each light emitting unit ELP includes a circular portion extracting blue light by the resonator structure and an annular portion surrounding the circular portion and extracting yellow light. In FIG. 6, the portion extracting blue light and the portion extracting yellow light are denoted by reference signs B and Y, respectively. In this way, different light-emission colors are planarly arranged, and color balance for white color can be easily achieved.

Figure 7:
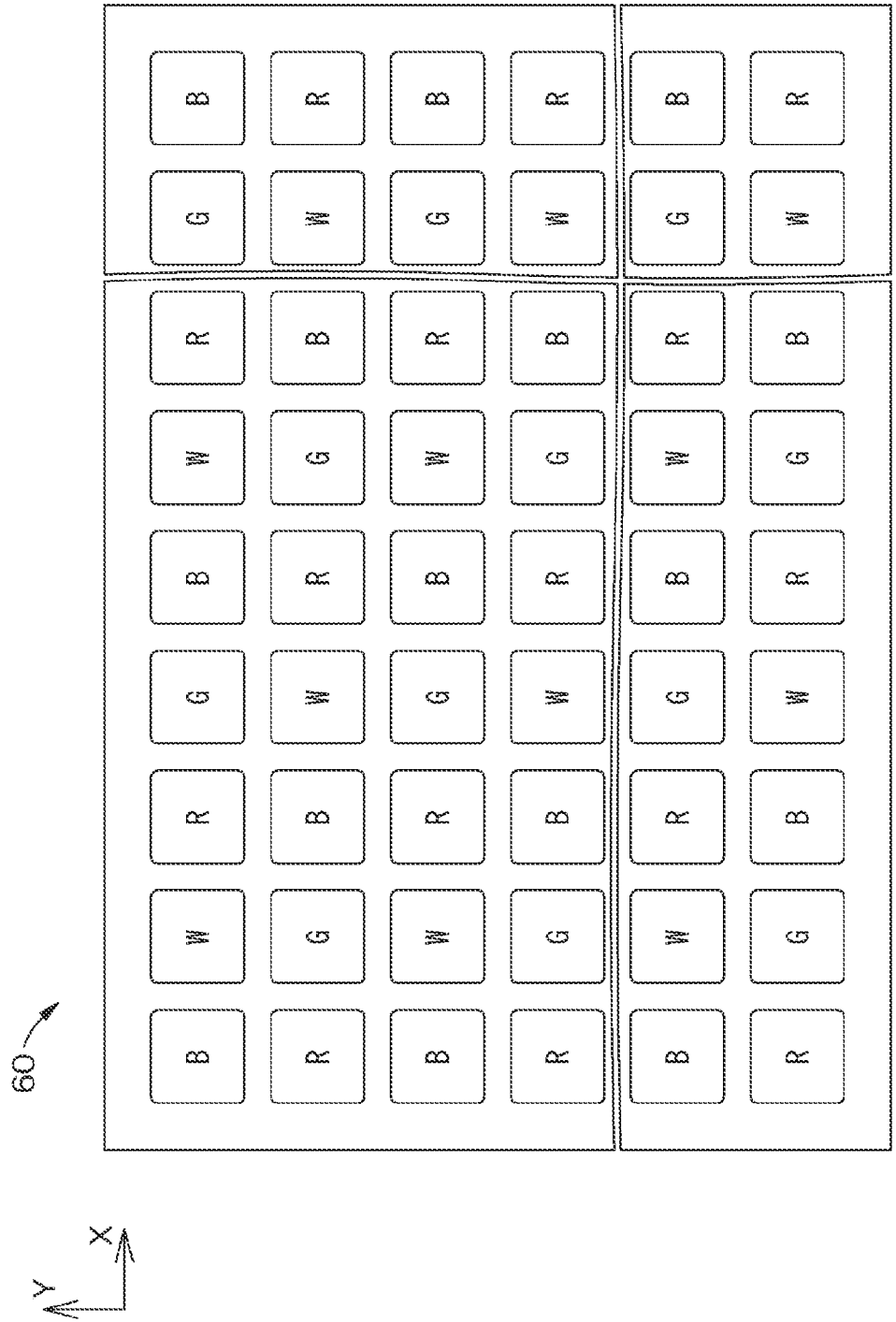
FIG. 7 is a schematic plan view for explaining an arrangement relationship between the color filters in the display device.

FIG. 7 is a schematic plan view for explaining an arrangement relationship between the color filters in the display device.

As illustrated in FIG. 2, the color filter 60 is disposed above the light emitting units ELP. The color filters for predetermined colors are disposed above the light emitting units ELP according to the colors to be displayed by the pixels, respectively. In FIG. 7, red, green, blue, and white (transparent) color filter portions are denoted by reference signs R, G, B, and W, respectively.

Figure 8:
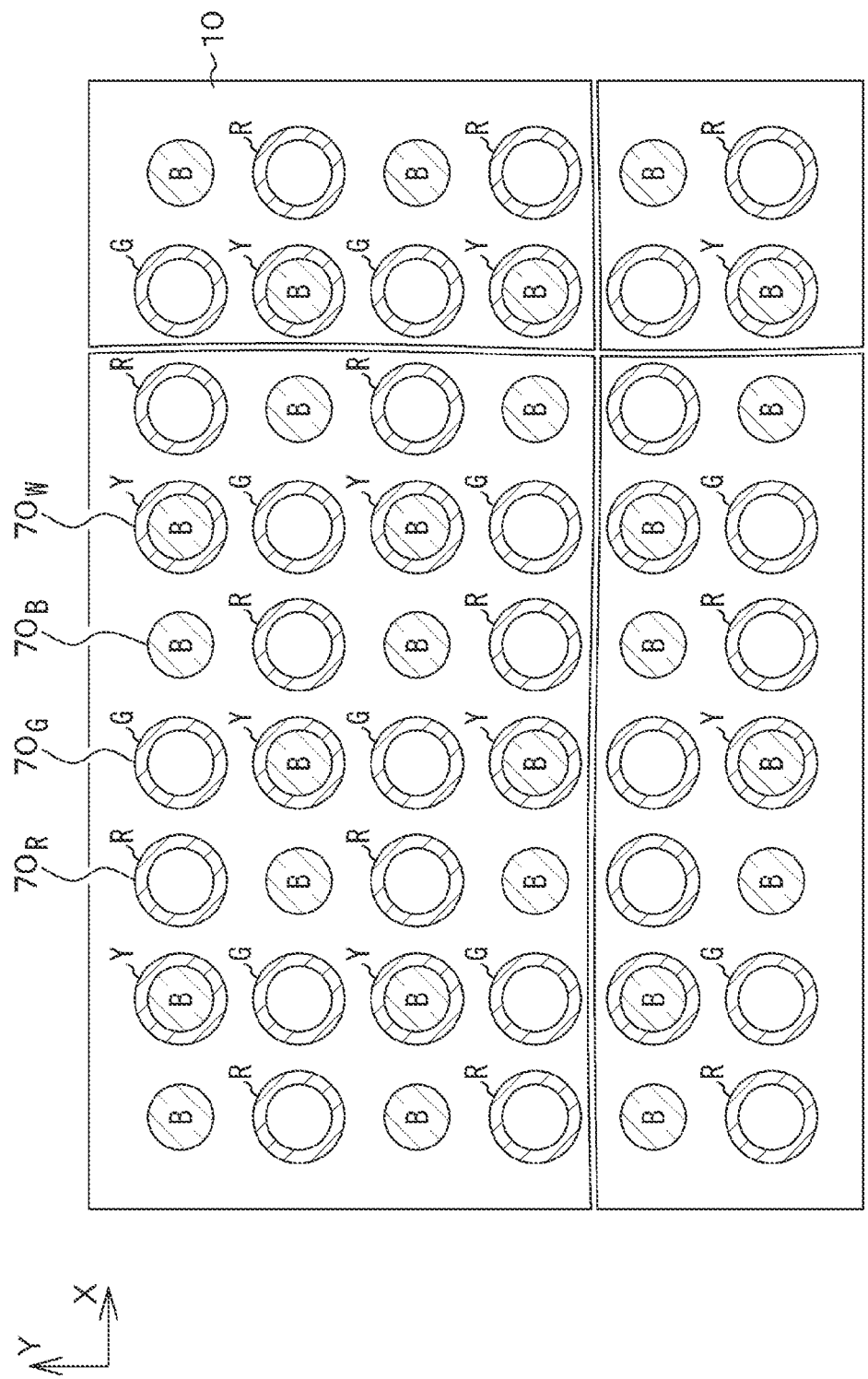
FIG. 8 is a schematic plan view for explaining shapes of light emitting regions of pixels observed through the color filters.

FIG. 8 is a schematic plan view for explaining shapes of light emitting regions of pixels observed through the color filters.

A light emitting region of a blue color pixel $70_B$ has a planar shape corresponding to a circular shape in which blue light is extracted from a light emitting unit ELP.

On the other hand, a light emitting region of a red color pixel $70_R$ has a planar shape corresponding to an annular shape in which yellow light is extracted from a light emitting unit ELP. More specifically, as illustrated in FIG. 2, the yellow light is transmitted through the red color filter $61_R$, thereby extracting red light. Similarly, a light emitting region of a green color pixel $70_G$ also has a planar shape corresponding to an annular shape in which yellow light is extracted from a light emitting unit ELP. More specifically, as illustrated in FIG. 2, the yellow light is transmitted through the green color filter $61_G$, thereby extracting green light.

In addition, a light emitting region of a white color pixel $70_W$ has a shape in which a planar shape corresponding to a circular shape in which blue light is extracted from a light emitting unit ELP is combined with a planar shape corresponding to an annular shape in which yellow light is extracted from the light emitting unit ELP.

As described above, in the display device 1, the shapes of the light emitting regions are different from each other depending on the colors to be displayed. That is, as shapes of the light emitting regions of the pixels observed through the color filters, the circular shape and the annular shape are mixed.

The detailed structure of the display device 1 has been described above. The display device 1 described above can be manufactured as follows.

Figure 11:
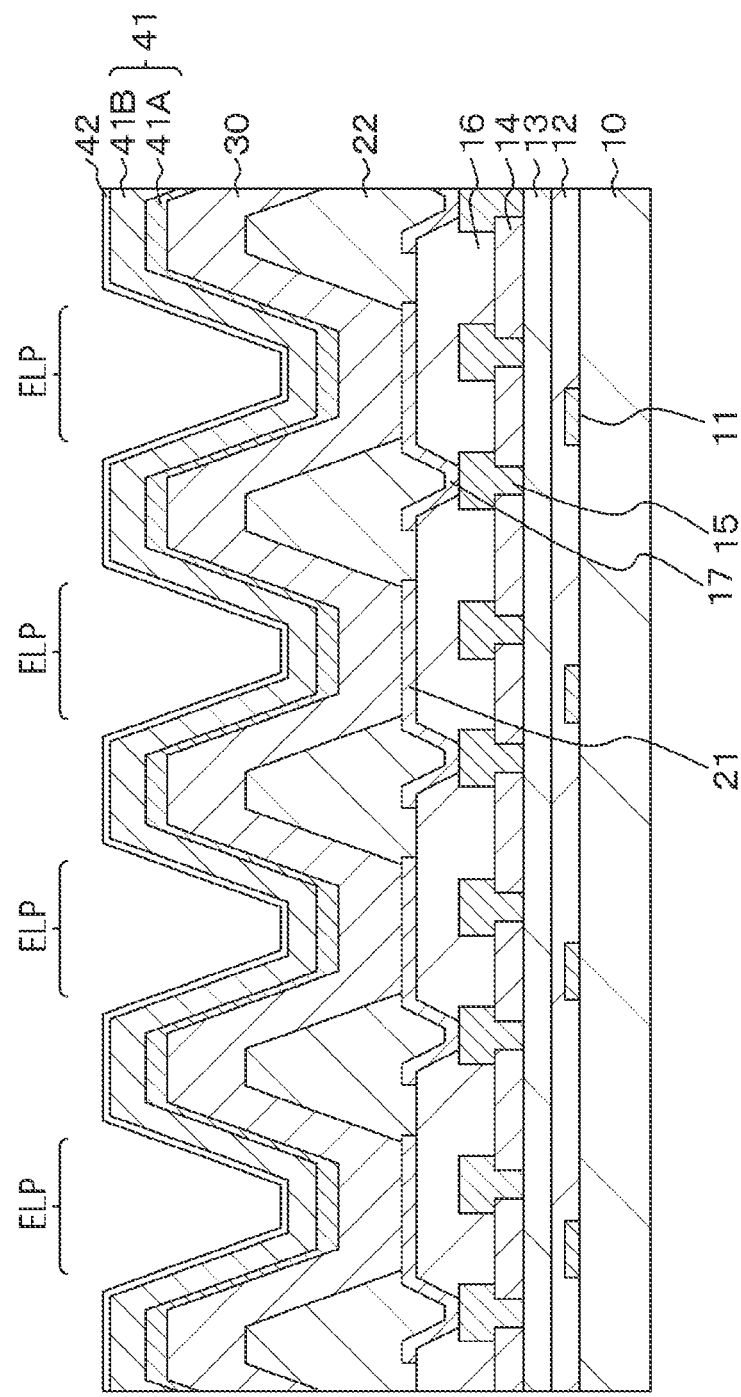
FIG. 11 is a schematic partial cross-sectional view for explaining the method for manufacturing the display device according to the first embodiment, continuing from FIG. 10.

FIGS. 9 to 11 are schematic partial cross-sectional views for explaining a method for manufacturing the display device according to the first embodiment.

Hereinafter, the method for manufacturing the display device 1 will be described with reference to these drawings.

[Step-100] (See FIGS. 9A and 9B)

A substrate 10 is prepared, and drive circuits including thin film transistors are formed by forming a predetermined film on the substrate 10 and subjecting the film to a patterning process. Subsequently, a planarizing film 14 is formed on an entire surface including upper surfaces of the drive circuits by a spin coating method, a slit coating method, a sputtering method, a CVD method, or the like. Thereafter, openings are formed in the planarizing film 14, and then source/drain electrodes 15 are formed therein. Subsequently, after a planarizing film 16 is formed on an entire surface, contact plugs 17 and lower electrodes 21 are formed by forming a predetermined film and subjecting the film to a patterning process. Thereafter, as a material layer 22A for forming partition walls 22, a film is formed by a sputtering method, a CVD method, or the like using an inorganic material such as silicon oxynitride ($SiO_xN_y$) (see FIG. 9A).

Subsequently, the material layer 22A is patterned by a lithography method and a dry etching method to form pixel openings each having a predetermined concave structure, so that partition walls 22 each having an inclined surface are formed (see FIG. 9B).

[Step-110] (See FIG. 10)

Thereafter, an organic layer 30 emitting white light is formed, for example, by sequentially forming, on an entire surface including upper surfaces of the lower electrode 21 and upper surfaces of the partition walls 22, a hole injection layer, a hole transport layer, a red light emitting layer, a light emission separation layer, a blue light emitting layer, a green light emitting layer, an electron transport layer, and an electron injection layer. Note that the organic layer 30 is formed such that the optical distance L described above satisfies the following condition:

$2L/\lambda + \Phi/2\pi = m$ where, $m$ is an integer.

[Step-180] (see FIG. 11)

Subsequently, an upper electrode 41 as a cathode electrode is formed on an entire surface of the organic layer 30.

For example, the upper electrode 41 can be obtained by forming a semi-transmissive electrode 41A made of a magnesium-silver alloy (MgAg) by a vapor deposition method, and then forming a transmissive electrode 41B made of indium zinc oxide (IZO) by a sputtering method. Subsequently, a protective film 42 is formed by a known method if necessary.

Thereafter, after a high refractive index material layer 51 is formed on an entire surface, a counter substrate having a color filter 60 formed thereon, which is not illustrated, is bonded to the high refractive index material layer 51, thereby obtaining a display device 1 (see FIG. 2).

Second Embodiment

A second embodiment is a modification of the first embodiment. In the first embodiment, the inclined surface of the partition wall is formed to be uniformly inclined. On the other hand, the second embodiment is different in that an inclined surface of a partition wall is formed in a stepwise manner to be gently inclined on a lower electrode side thereof.

Figure 12:
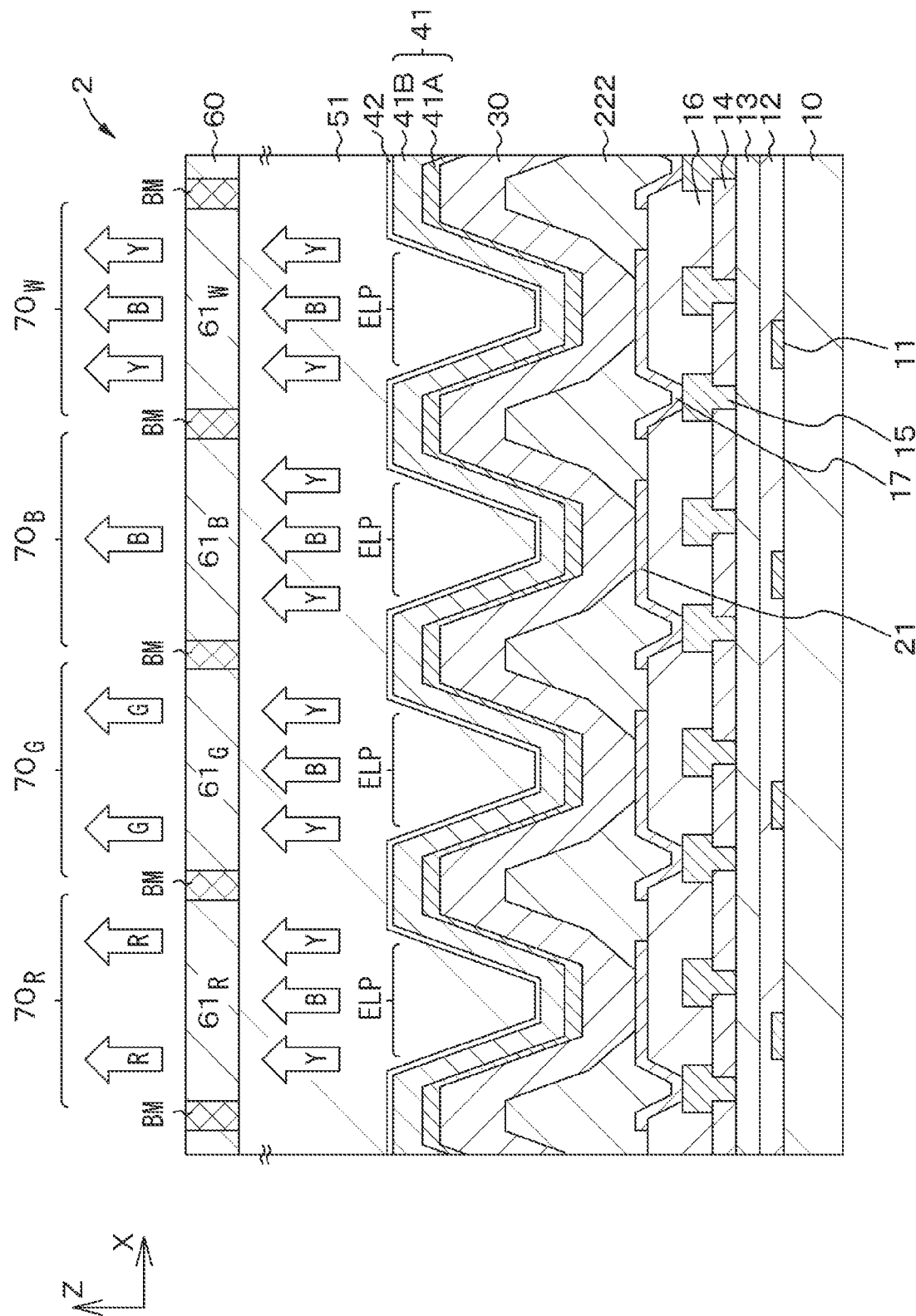
FIG. 12 is a schematic partial cross-sectional view of a display deice according to a second embodiment.
Figure 13:
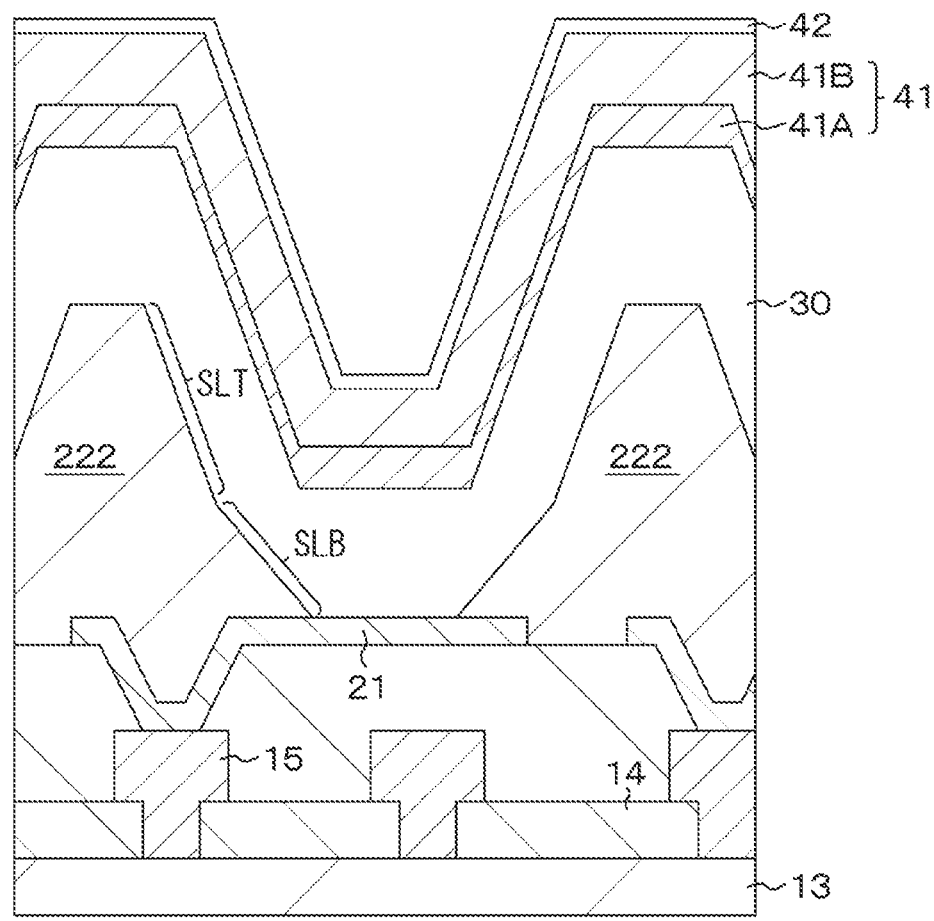
FIG. 13 is a schematic partial cross-sectional view for explaining a structure of an inclined surface of a partition wall in a pixel.

FIG. 12 is a schematic partial cross-sectional view of a display device according to the second embodiment. FIG. 13 is a schematic partial cross-sectional view for explaining a structure of an inclined surface of a partition wall in a pixel. Note that, for a schematic plan view of the display device according to the second embodiment, FIG. 1 may be applied while replacing the display device 1 with a display device 2.

As illustrated in FIG. 12, in the display device 2, an inclined surface of a partition wall 222 is formed in a stepwise manner to be gently inclined on the lower electrode 21 side. That is, as illustrated in FIG. 13, the inclined surface of the partition wall 222 is divided into an inclined surface SLT on the organic layer 30 side and an inclined surface SLB on the lower electrode 21 side. The inclined surface SLB is formed to have gentler inclination than the inclined surface SLT. The above-described shape can be obtained, for example, by changing the etching condition to be stepwise when the process illustrated in FIG. 9B, which is referred to for the first embodiment, is performed.

In the second embodiment, since an angle formed by the partition wall 222 and the lower electrode 21 is gentle, the coating property of the organic layer 30 is improved. Accordingly, the organic layer 30 can suppress a variation in light emission color. A method for manufacturing the display device 2 is basically the same as that described in the first embodiment, and thus, the description thereof will be omitted.

Third Embodiment

A third embodiment is a modification of the first embodiment. In the first embodiment, light in a band having a blue light wavelength as a center wavelength is extracted by a resonator structure formed between the lower electrode and the upper electrode, and yellow light (including a green light component and a red light component) is extracted by total reflection at an interface between the organic layer and the partition wall. On the other hand, the third embodiment is different from the first embodiment in both light extracted by the resonator structure and light extracted by total reflection at the interface between the organic layer and the partition wall.

Figure 14:
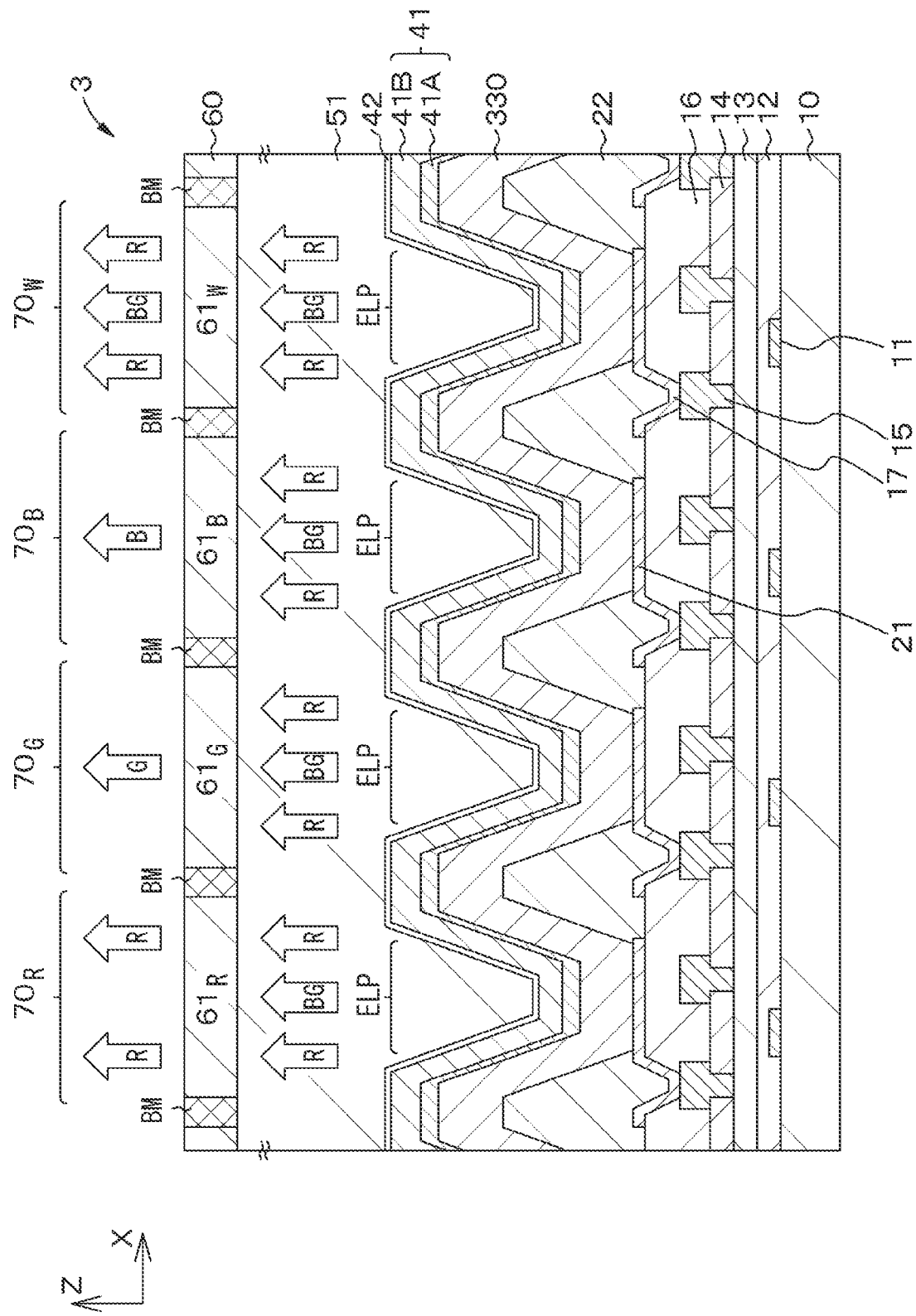
FIG. 14 is a schematic partial cross-sectional view of a display deice according to a third embodiment.

FIG. 14 is a schematic partial cross-sectional view of a display device according to the third embodiment. Note that, for a schematic plan view of the display device according to the third embodiment, FIG. 1 may be applied while replacing the display device 1 with a display device 3.

The display device 3 according to the third embodiment is different from that according to the first embodiment in a structure of an organic layer 330. The organic layer 330 includes a red light emitting layer, a blue light emitting layer, and a green light emitting layer, and a light emission separation layer is disposed between the red light emitting layer and the blue light emitting layer. A film thickness ratio of the light emission separation layer in the organic layer 330 is relatively lower in a portion located above the inclined surface of the partition wall 22 than in a portion located above the lower electrode 21. A stack relationship of the organic layer 330 will be described in detail later with reference to FIG. 16, which will be described later.

Figure 15:
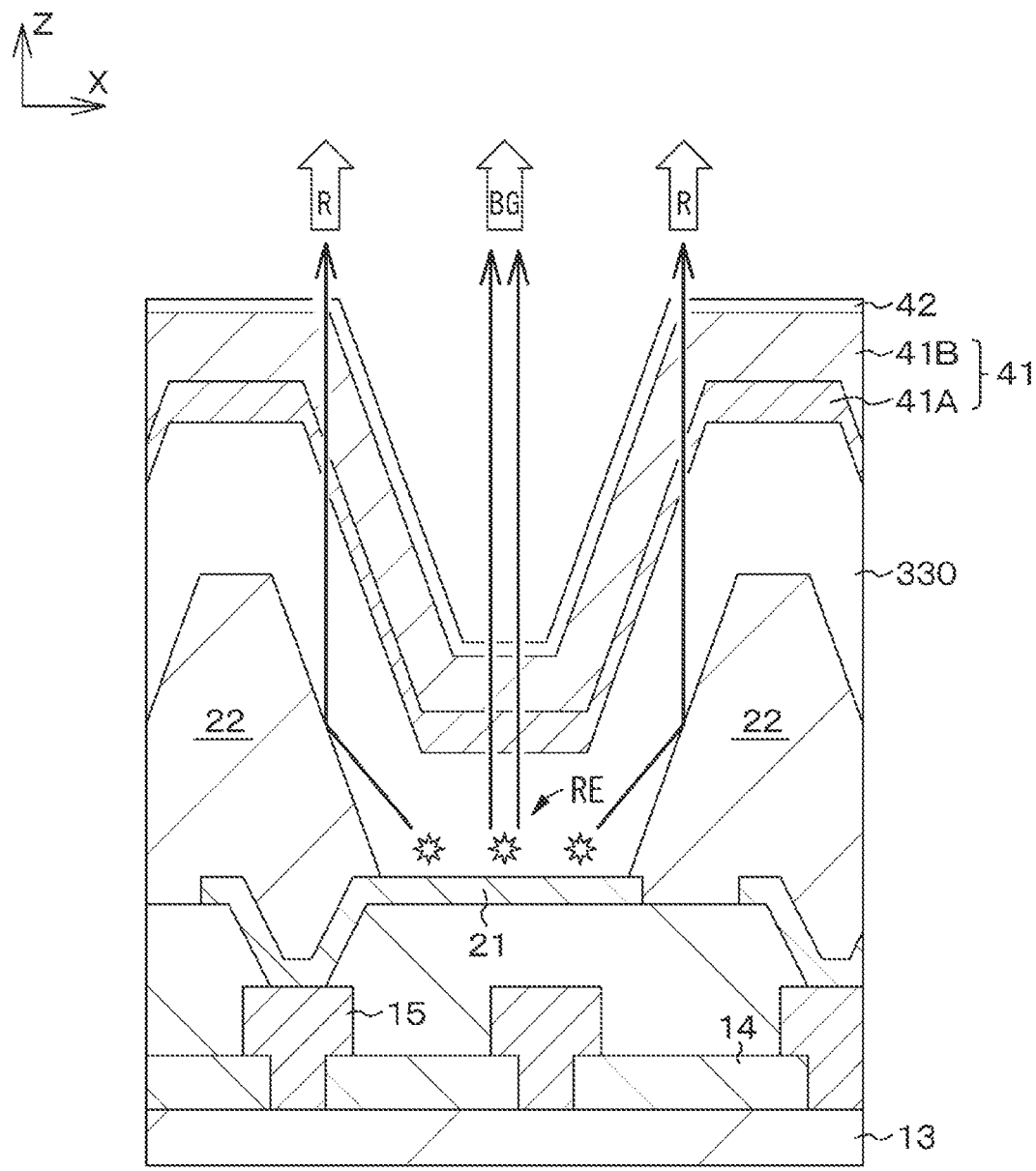
FIG. 15 is a schematic partial cross-sectional view for explaining extraction of light from a pixel.

FIG. 15 is a schematic partial cross-sectional view for explaining extraction of light from a pixel.

A portion between the lower electrode 21 and the upper electrode 41 (denoted by reference sign RE in the drawing) is configured to satisfy a resonance condition with a predetermined wavelength as a center wavelength of a band. More specifically, light in a band having an intermediate wavelength between a blue light wavelength and a green light wavelength as a center wavelength is extracted to the outside by a resonator structure formed between the lower electrode 21 and the upper electrode 41. In addition, red light is extracted to the outside by total reflection at an interface between the organic layer 330 and the partition wall 22. The organic layer 330 is formed to satisfy the above-described condition.

Figure 16:
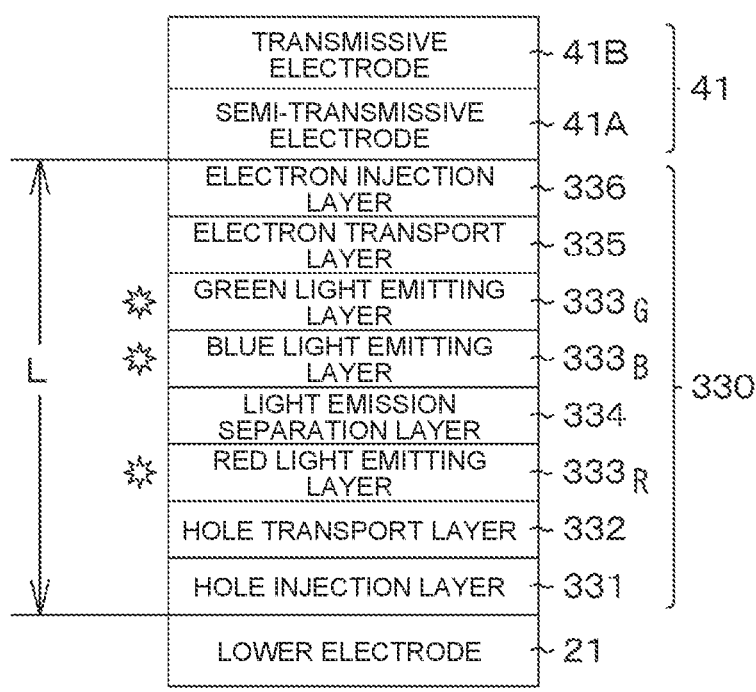
FIG. 16 is a schematic diagram for explaining a configuration of an organic layer.

The resonator structure formed between the lower electrode 21 and the upper electrode 41 will be described. FIG. 16 illustrates a configuration of an organic layer including a red light emitting layer, a blue light emitting layer, and a green light emitting layer.

As illustrated in the drawing, the organic layer 330 is formed by stacking, on the lower electrode 21 side, a hole injection layer 331, a hole transport layer 332, a red light emitting layer $333_R$, a light emission separation layer 334, a blue light emitting layer $333_B$, a green light emitting layer $333_G$, an electron transport layer 335, and an electron injection layer 336. A thickness of each layer is preferably set in a range of, for example, 1 to 20 nanometers for the hole injection layer, 10 to 200 nanometers for the hole transport layer, 5 to 50 nanometers for each light emitting layer, and 10 to 200 nanometers for the electron transport layer. The semi-transmissive electrode 41A is set in a range of 3 to 20 nanometers, and the transmissive electrode 41B is set in a range of 10 to 200 nanometers. More specifically, the thickness of each layer is set to satisfy the following condition.

In the resonator structure formed between the lower electrode 21 and the upper electrode 41, when a phase shift of reflected light generated between the lower electrode 21 and the upper electrode 41 (more specifically, the semi-transmissive electrode 41A) is denoted by reference sign Φ, an optical distance between the lower electrode 21 and the upper electrode 41 (more specifically, the semi-transmissive electrode 41A) is denoted by reference sign L, and a center wavelength of a predetermined band which is an intermediate wavelength between a blue light wavelength and a green light wavelength is denoted by reference sign λ, the thickness of each layer is set such that the optical distance L illustrated in FIG. 4A satisfies the following condition:

$2L/\lambda + \Phi/2\pi = m$ where, $m$ is an integer.

When the film thickness set to satisfy a resonance condition for the intermediate wavelength between the blue light wavelength and the green light wavelength in a flat area of the pixel, blue light and green light are extracted by a microcavity effect, and the remaining red light is extracted by using reflection at the interface of the partition wall. In this configuration, a blue light emitting region and a green light emitting region are arranged to overlap each other, and a red light emitting region is juxtaposed therewith. Therefore, they can be treated as emission of white light as a whole.

In addition, the light emission separation layer is formed such that a film thickness ratio thereof in the organic layer 330 is relatively lower in a portion located above the inclined surface of the partition wall 22 than in a portion located above the lower electrode 21. Therefore, a light emission center in the portion of the organic layer 330 located on the inclined surface of the partition wall 22 shifts toward the red light emitting layer, with respect to the portion of the organic layer 330 located on the lower electrode 21. Accordingly, each color component can be more efficiently extracted.

The extraction of light from the light emitting unit ELP has been described above. Next, arrangement of light emitting units ELP, arrangement of color filters, and light emitting regions of pixels observed through the color filters in the display region will be described with reference to the drawings.

Figure 17:
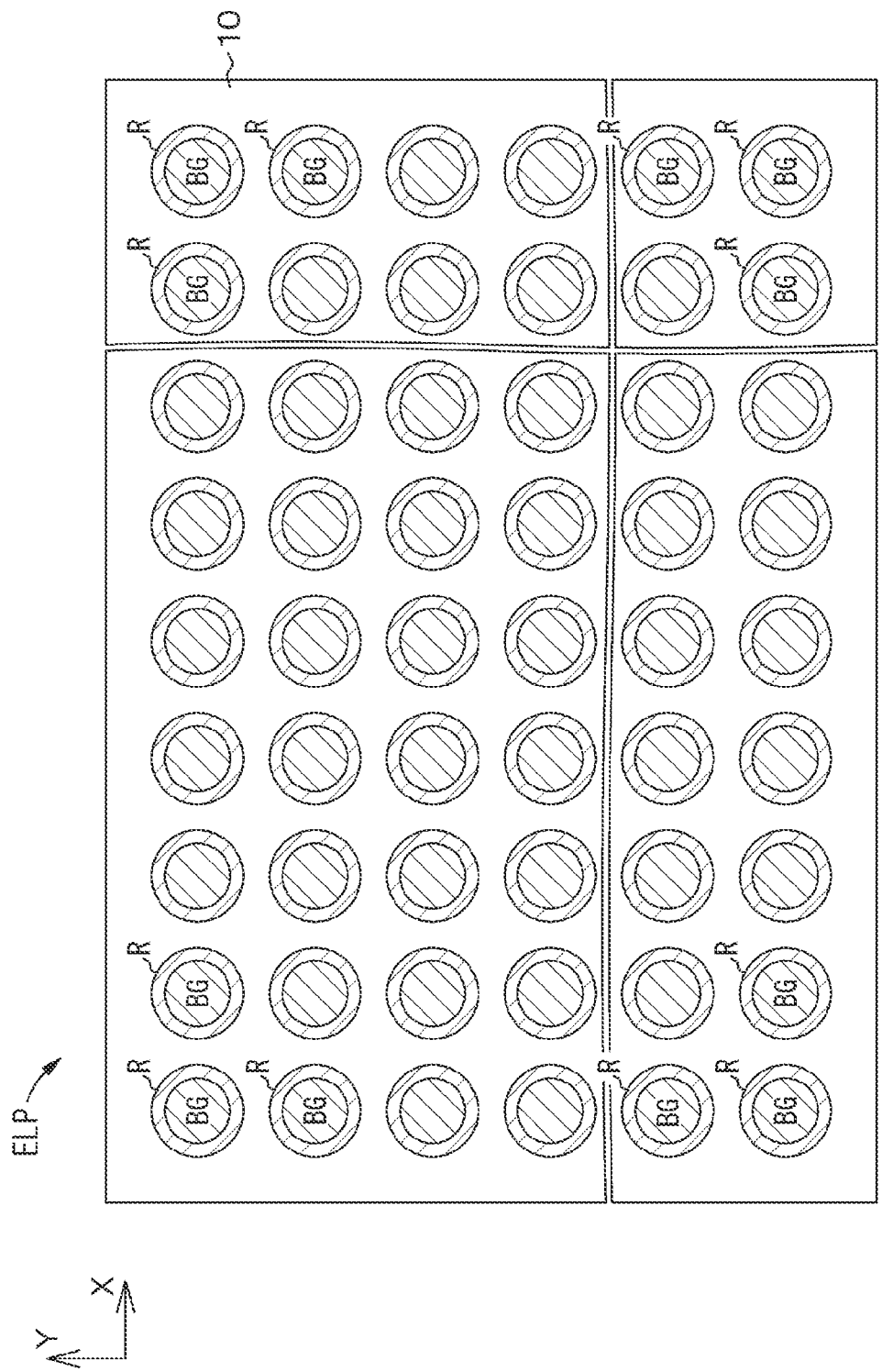
FIG. 17 is a schematic plan view for explaining an arrangement relationship between light emitting units in the display device.

FIG. 17 is a schematic plan view for explaining an arrangement relationship between light emitting units in the display device.

In the light emitting regions of the display device 3, the light emitting units ELP having the above-described structure are arrayed in a two-dimensional matrix form. Each light emitting unit ELP includes a circular portion extracting blue light and green light by the resonator structure and an annular portion surrounding the circular portion and extracting red light. In FIG. 17, the portion extracting blue light and green light and the portion extracting red light are denoted by reference signs BG and R, respectively. In this way, different light-emission colors are planarly arranged, and color balance for white color can be easily achieved.

Figure 18:
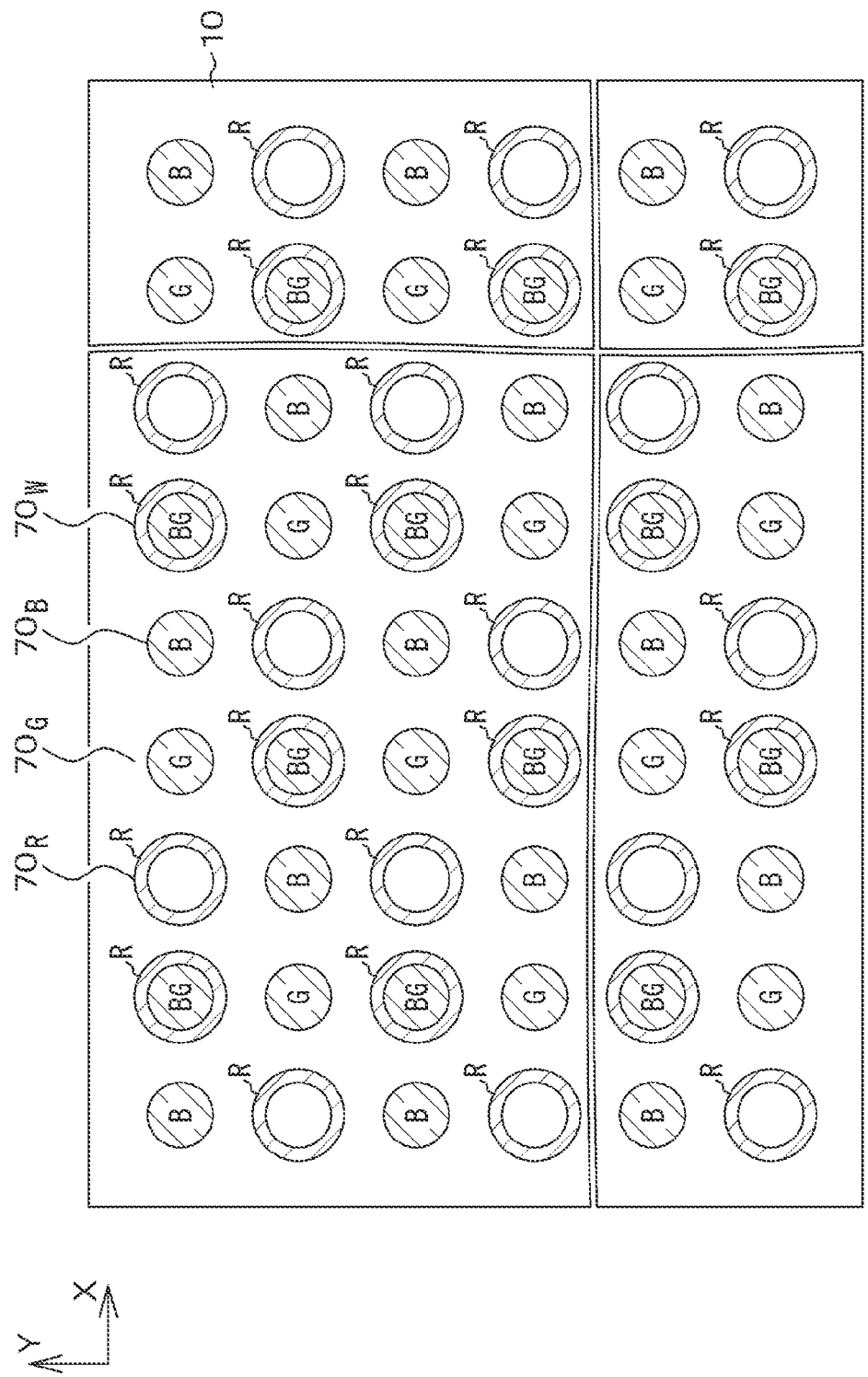
FIG. 18 is a schematic plan view for explaining shapes of light emitting regions of pixels observed through color filters.

FIG. 18 is a schematic plan view for explaining shapes of light emitting regions of pixels observed through the color filters.

A light emitting region of a blue color pixel $70_B$ and a light emitting region of a green color pixel $70_G$ have a planar shape corresponding to a circular shape in which blue light and green light are extracted from respective light emitting units ELP. More specifically, as illustrated in FIG. 14, the blue light and the green light are transmitted through the blue color filter $61_B$, thereby extracting the blue light. Similarly, the blue light and the green light are transmitted through the green color filter $61_B$, thereby extracting the green light.

On the other hand, a light emitting region of a red color pixel $70_R$ has a planar shape corresponding to an annular shape in which red light is extracted from a light emitting unit ELP. More specifically, as illustrated in FIG. 14, the red light is transmitted through the red color filter $61_R$, thereby extracting the red light.

In addition, a light emitting region of a white color pixel $70_W$ has a shape in which a planar shape corresponding to a circular shape in which blue light and green light are extracted from a light emitting unit ELP is combined with a planar shape corresponding to an annular shape in which red light is extracted from the light emitting unit ELP.

As described above, in the display device 3 as well, the shapes of the light emitting regions are different from each other depending on the colors to be displayed. That is, as shapes of the light emitting regions of the pixels observed through the color filters, the circular shape and the annular shape are mixed.

A method for manufacturing the display device 3 is basically the game as that described in the first embodiment, and thus, the description thereof will be omitted.

Fourth Embodiment

In a fourth embodiment, in addition to the lower electrodes arranged on the flat areas of the pixels, lower electrodes are also arranged on the inclined surfaces of the partition walls.

Figure 19:
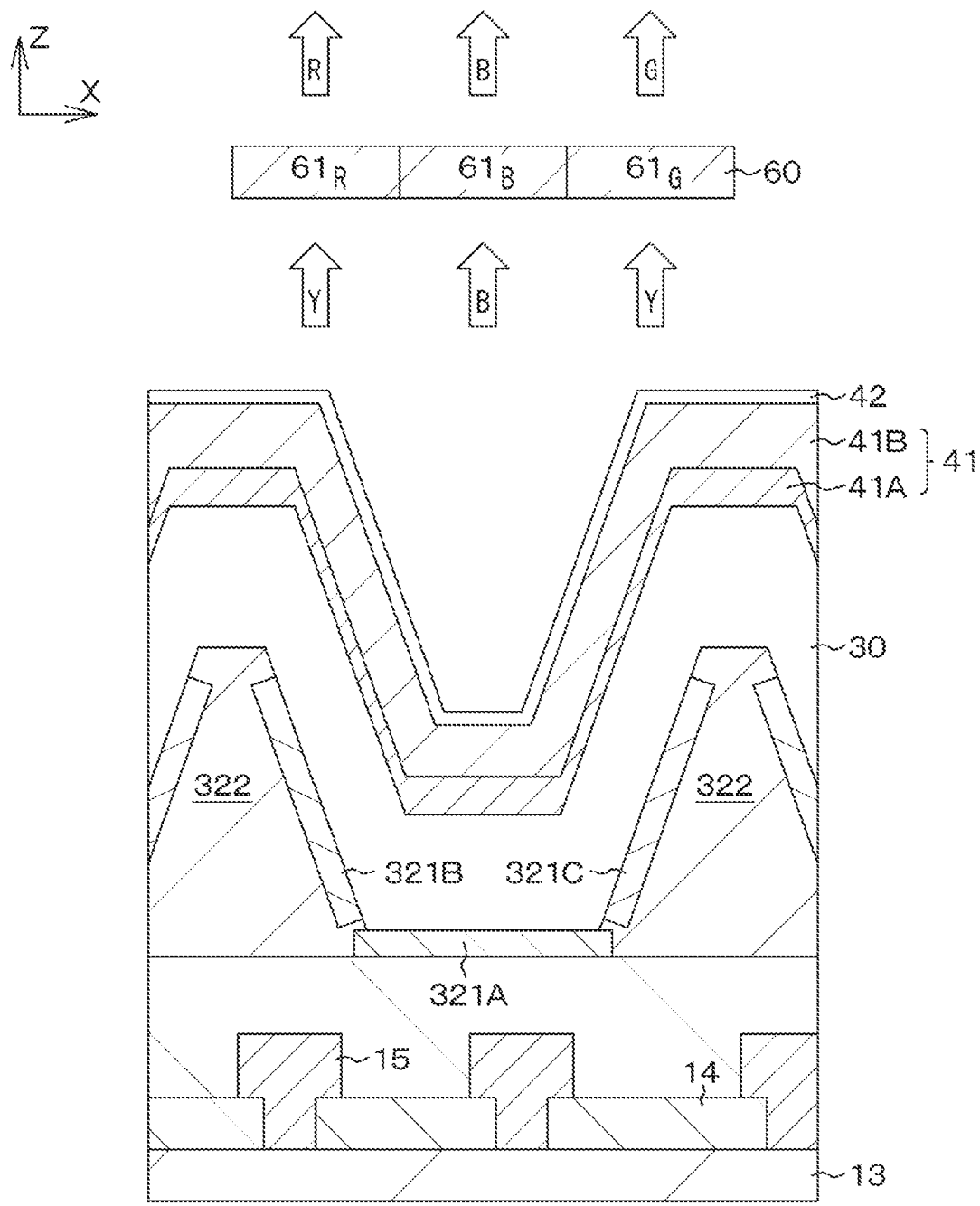
FIG. 19 is a schematic partial cross-sectional view for explaining a pixel structure in a display device according to a fourth embodiment.

FIG. 19 is a schematic partial cross-sectional view for explaining a pixel structure in a display device according to the fourth embodiment.

In FIG. 19, a lower electrode 321A corresponds to the lower electrode 21 in the first embodiment. Lower electrodes 321B and 321C are disposed on inclined surfaces of partition walls 322. The lower electrodes 321A, 321B, and 321C are formed such that voltages are independently supplied thereto.

Figure 20A:
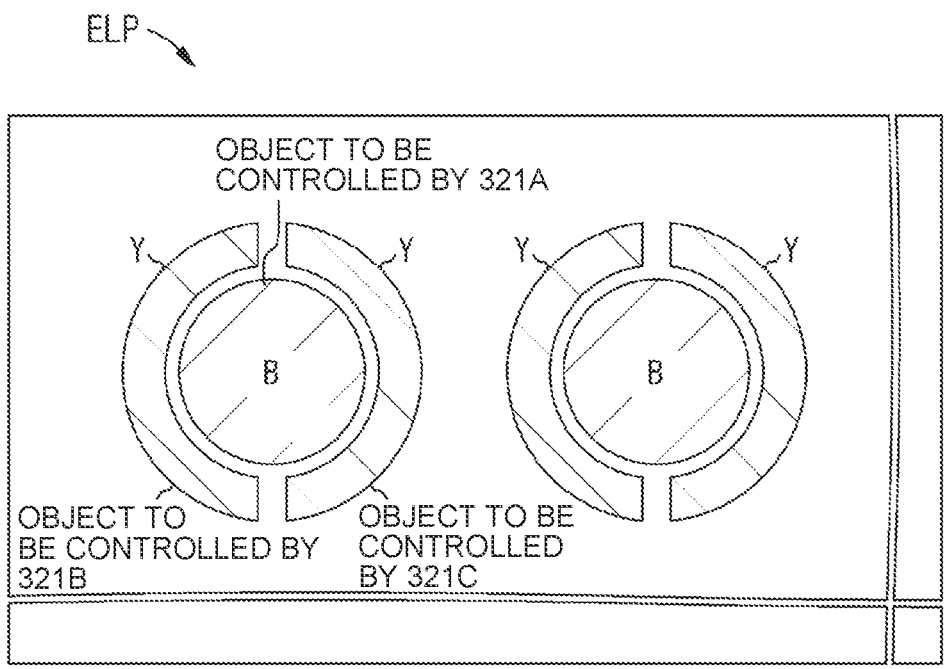
FIG. 20A is a schematic plan view for explaining an arrangement relationship between light emitting units in the display device.
Figure 20B:
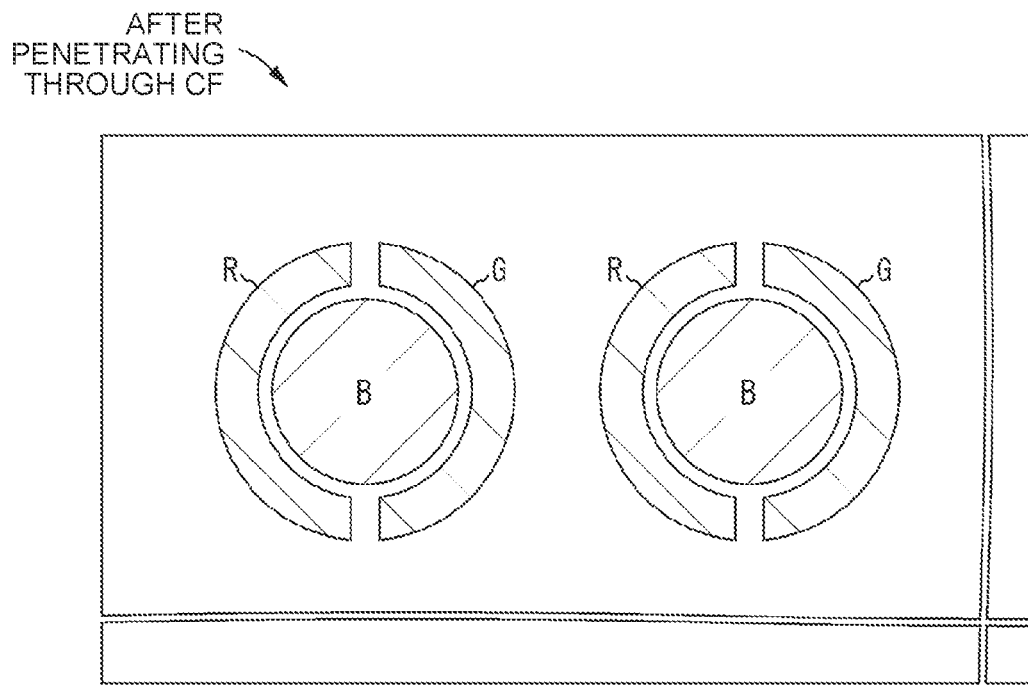
FIG. 20B is a schematic plan view for explaining shapes of light emitting regions of pixels observed through color filters.

FIG. 20A is a schematic plan view for explaining an arrangement relationship between light emitting units in the display device. FIG. 20B is a schematic plan view for explaining shapes of light emitting regions of pixels observed through color filters.

As in the first embodiment, the organic layer 30 is formed such that blue light is extracted by the resonator structure. Therefore, the blue light is extracted by applying a voltage to the lower electrode 321A. In addition, by applying voltages to the lower electrodes 321B and 321C, yellow light (including a green light component and a red light component) is extracted to the outside. Red light is extracted from the yellow light by the lower electrode 321B through the red color filter $61_R$, and green light is extracted from the yellow light by the lower electrode 321C through the green color filter $61_G$.

In the various display devices according to the present disclosure described above, light in a band is extracted to the outside by the resonator structure formed between the lower electrode and the upper electrode, and light in a band different from the predetermined band is extracted to the outside by total reflection at the interface between the organic layer and the partition wall. Therefore, since the different light-emission colors are planarly arranged, color balance for white color can be easily achieved.

Example of Resonator Structure Applied to Each Embodiment

In the display devices according to the present disclosure described above, various configurations can be taken as the resonator structure. Hereinafter, an example of the resonator structure will be described with reference to the drawings.

RESONATOR STRUCTURE: FIRST EXAMPLE

FIG. 21A is a schematic cross-sectional view for explaining a first example of the resonator structure.

In the first example, the lower electrodes 21 are formed to have a common film thickness in the respective pixels 70. The same applies to the upper electrodes 41.

Reflection plates 71 are disposed below the lower electrodes 21 of the pixels 70 with optical adjustment layers 72 interposed therebetween, respectively. The organic layers 30 have resonator structures resonating generated light between the reflection plates 71 and the upper electrodes 41, respectively.

The reflection plates 71 are formed to have a common film thickness in the respective pixels 70. The optical adjustment layers 72 have different film thicknesses from each other depending on colors to be displayed by the pixels. Since the optical adjustment layers $72_R$, $72_G$, and $72_B$ have different film thicknesses from each other, it is possible to set optical distances for generating optimum resonances for wavelengths of light corresponding to the colors to be displayed, respectively.

In the example illustrated in the drawing, the reflection plates 71 in the pixels $70_R$, $70_G$, and $70_B$ are arranged such that upper surfaces thereof are aligned with each other. As described above, since the optical adjustment layers 72 have different film thicknesses from each other depending on the colors to be displayed by the pixels, positions of upper surfaces of the upper electrodes 41 are different from each other depending on types of pixels $70_R$, $70_G$, and $70_B$.

The reflection plate 71 can be formed using, for example, a metal such as aluminum (Al), silver (Ag), or copper (Cu), or an alloy containing the foregoing metal as a main component.

The optical adjustment layers 72 can be formed using, for example, an inorganic insulating material such as silicon nitride ($SiN_x$), silicon oxide ($SiO_x$), or silicon oxynitride ($SiO_xN_y$), or an organic resin material such as an acryl-based resin or a polyimide-based resin. The optical adjustment layers 72 may be each a single layer or a lamination film made of the plurality of materials. Furthermore, the optical adjustment layers 72 may be different from each other in the number of stacks depending on types of pixels 70.

The lower electrodes 21 can be formed using a transparent conductive material such as indium tin oxide (ITO), indium zinc oxide (IZO) or zinc oxide (ZnO).

The upper electrodes 41 need to function as semi-transmissive reflection films. The upper electrodes 41 can be formed using magnesium (Mg), silver (Ag), a magnesium-silver alloy (MgAg) containing them as main components, an alloy containing an alkali metal or an alkaline earth metal, or the like.

RESONATOR STRUCTURE: SECOND EXAMPLE

FIG. 21B is a schematic cross-sectional view for explaining a second example of the resonator structure.

In the second example as well, the lower electrodes 21 are formed to have a common film thickness and the upper electrodes 41 are also formed to have a common film thickness in the respective pixels 70.

Further, in the second example as well, reflection plates 71 are disposed below the lower electrodes 21 of the pixels 70 with optical adjustment layers 72 interposed therebetween, respectively. The organic layers 30 have resonator structures resonating generated light between the reflection plates 71 and the upper electrodes 41, respectively. As in the first example, the reflection plates 71 are formed to have a common film thickness in the respective pixels 70, and the optical adjustment layers 72 have different film thicknesses from each other depending on colors to be displayed by the pixels.

In the first example illustrated in FIG. 21A, the reflection plates 71 in the pixels $70_R$, $70_G$, and $70_B$ are arranged such that upper surfaces thereof are aligned with each other, and positions of upper surfaces of the upper electrodes 41 are different from each other depending on types of pixels $70_R$, $70_G$, and $70_B$.

On the other hand, in the second example illustrated in FIG. 21B, the upper electrodes 41 are arranged such that upper surfaces thereof are aligned with each other in the pixels $70_R$, $70_G$, and $70_B$. In order to align the upper surfaces of the upper electrodes 41 with each other, the reflection plates 71 in the pixels $70_R$, $70_G$, and $70_B$ are arranged such that upper surfaces thereof are different in position in a vertical direction depending on types of pixels $70_R$, $70_G$, and $70_B$. Accordingly, lower surfaces of the reflection plates 71 (in other words, surfaces of bases 73 denoted by reference sign 73 in the drawing) have a shape like steps corresponding to the types of pixels 70, respectively.

Materials constituting the reflection plates 71, the optical adjustment layers 72, the lower electrodes 21, and the upper electrodes 41 are the same as those described in the first example, and thus, the description thereof is omitted.

RESONATOR STRUCTURE: THIRD EXAMPLE

FIG. 22A is a schematic cross-sectional view for explaining a third example of the resonator structure.

In the third example as well, the lower electrodes 21 are formed to have a common film thickness and the upper electrodes 41 are also formed to have a common film thickness in the respective pixels 70.

Further, in the third example as well, reflection plates 71 are disposed below the lower electrodes 21 of the pixels 70 with optical adjustment layers 72 interposed therebetween, respectively. The organic layers 30 have resonator structures resonating generated light between the reflection plates 71 and the upper electrodes 41, respectively. Similarly to the first and second examples, the optical adjustment layers 72 have different film thicknesses from each other depending on colors to be displayed by the pixels. In addition, similarly to the second example, the pixels $70_R$, $70_G$, and $70_B$ are arranged such that the positions of the upper surfaces of the upper electrodes 41 are aligned with each other.

In the second example illustrated in FIG. 21B, in order to align the upper surfaces of the upper electrodes 41 with each other, the lower surfaces of the reflection plates 71 have a shape like steps corresponding to the types of pixels 70, respectively.

On the other hand, in the Third example illustrated in FIG. 22A, the reflection plates 71 are set to have different film thicknesses from each other depending on types of pixels $70_R$, $70_G$, and $70_B$. More specifically, the film thicknesses of the reflection plates $71_B$, $71_G$, and $71_B$ are set such that the lower surfaces thereof are aligned with each other.

Materials constituting the reflection plates 71, the optical adjustment layers 72, the lower electrodes 21, and the upper electrodes 41 are the same as those described in the first example, and thus, the description thereof is omitted.

RESONATOR STRUCTURE: FOURTH EXAMPLE

FIG. 22B is a schematic cross-sectional view for explaining a fourth example of the resonator structure.

In the first example illustrated in FIG. 21A, the lower electrodes 21 are formed to have a common film thickness and the upper electrodes 41 are also formed to have a common film thickness in the respective pixels 70. In addition, reflection plates 71 are disposed below the lower electrodes 21 of the pixels 70 with optical adjustment layers 72 interposed therebetween, respectively.

On the other hand, in the fourth example illustrated in FIG. 22B, the optical adjustment layers 72 are omitted, and the lower electrodes 21 are set to have different film thicknesses from each other depending on types of pixels $70_R$, $70_G$, and $70_B$.

The reflection plates 71 are formed to have a common film thickness in the respective pixels 70. The lower electrodes 21 have different film thicknesses from each other depending on colors to be displayed by the pixels. Since the lower electrodes $21_R$, $31_G$, and $31_B$ have different film thicknesses from each other, it is possible to set optical distances for generating optimum resonances for wavelengths of light corresponding to the colors to be displayed, respectively.

Materials constituting the reflection plates 71, the optical adjustment layers 72, the lower electrodes 21, and the upper electrodes 41 are the same as those described in the first example, and thus, the description thereof is omitted.

RESONATOR STRUCTURE: FIFTH EXAMPLE

FIG. 23A is a schematic cross-sectional view for explaining a fifth example of the resonator structure.

In the first example illustrated in FIG. 21A, the lower electrodes 21 are formed to have a common film thickness and the upper electrodes 41 are also formed to have a common film thickness in the respective pixels 70. In addition, reflection plates 71 are disposed below the lower electrodes 21 of the pixels 70 with optical adjustment layers 72 interposed therebetween, respectively.

On the other hand, in the fifth example illustrated in FIG. 23A, the optical adjustment layers 72 are omitted, and instead, oxide films 74 are formed on surfaces of the reflection plates 71, respectively. The oxide films 74 are set to have different film thicknesses from each other depending on types of pixels $70_R$, $70_G$, and $70_B$.

The film thicknesses of the oxide films 74 are different from each other depending on colors to be displayed by the pixels. Since the oxide films $74_R$, $74_G$, and $74_B$ have different film thicknesses from each other, it is possible to set optical distances for generating optimum resonances for wavelengths of light corresponding to the colors to be displayed, respectively.

The oxide films 74 are films obtained by oxidizing the surfaces of the reflection plates 71, and are made of, for example, aluminum oxide, tantalum oxide, titanium oxide, magnesium oxide, zirconium oxide, or the like. The oxide films 74 function as insulating films for adjusting optical path lengths (optical distances) between the reflection plates 71 and the upper electrodes 41, respectively.

The oxide films 74 having different film thicknesses from each other depending on types of pixels $70_R$, $70_G$, and $70_B$ can be formed, for example, as follows.

First, an electrolytic solution is filled in a container, and a substrate having the reflection plate 71 formed thereon is immersed in the electrolytic solution. In addition, an electrode is disposed to face the reflection plate 71.

Then, a positive voltage is applied to the reflection plate 71 based on the electrode, and the reflection plate 71 is anodized. An oxide film formed by the anodization has a film thickness proportional to a voltage value with respect to the electrode. So, the anodization is performed in a state where a voltage corresponding to the type of pixel 70 is applied to each of the reflection plates $71_R$, $71_G$, and $71_B$.

Accordingly, the oxide films 74 having different film thicknesses can be formed in a lump.

Materials constituting the reflection plates 71, the lower electrodes 21, and the upper electrodes 41 are the same as those described in the first example, and thus, the description thereof is omitted.

RESONATOR STRUCTURE: SIXTH EXAMPLE

FIG. 23B is a schematic cross-sectional view for explaining a sixth example of the resonator structure.

In the sixth example, each pixel 70 is formed by stacking the lower electrode 21, the organic layer 30, and the upper electrode 41. Meanwhile, in the sixth example, the lower electrode 21 is formed to function as both an electrode and a reflection plate. The lower electrodes (serving as reflection plates as well) 31 are formed of a material having an optical constant selected depending on types of pixels $70_R$, $70_G$, and $70_B$, respectively. Since the lower electrodes (serving as reflection plates as well) 31 cause different phase shifts from each other, it is possible to set optical distances for generating optimum resonances for wavelengths of light corresponding to the colors to be displayed, respectively.

The lower electrodes (serving as reflection plates as well) 31 can be made of a single metal such as aluminum (Al), silver (Ag), gold (Au), or copper (Cu), or an alloy containing the foregoing metal as a main component. For example, the lower electrode (serving as a reflection plate as well) $31_R$ of the pixel $70_R$ can be formed of copper (Cu), and the lower electrode (serving as reflection plate as well) $31_G$ of the pixel $70_G$ and the lower electrode (serving as a reflection plate as well) $31_B$ of the pixel $70_B$ can be made of aluminum.

A material constituting the upper electrodes 41 is the same as that described in the first example, and thus, the description thereof is omitted.

RESONATOR STRUCTURE: SEVENTH EXAMPLE

FIG. 24 is a schematic cross-sectional view for explaining a seventh example of the resonator structure.

In the seventh example, basically, the sixth example is applied to the pixels $70_R$ and $70_G$, and the first example is applied to the pixel $70_B$. In this configuration as well, it is possible to set optical distances for generating optimum resonances for wavelengths of light corresponding to the colors to be displayed, respectively.

The lower electrodes (serving as reflection plates as well) $31_R$ and $31_G$ used for the pixels $70_R$ and $70_G$ can be made of a single metal such as aluminum (Al), silver (Ag), gold (Au), or copper (Cu), or an alloy containing the foregoing metal as a main component.

Materials constituting the reflection plate $71_B$, the optical adjustment layer $72_B$, and the lower electrode $21_B$ used for the pixel $70_B$ are the same as those described in the first example, and thus, the description thereof is omitted.

[Electronic Device]

The display device of the present disclosure described above can be used as a display an it (display device) of an electronic device in any field on which a video signal input to the electronic device or a video signal generated in the electronic device is displayed as an image or a video. As an example, it can be used as a display unit of, for example, a television set, a digital still camera, a notebook personal computer, a mobile terminal device such as a mobile phone, a video camera, a head mounted display, or the like.

The display device of the present disclosure also includes a module in a sealed configuration. As an example, a display module formed by attaching a counter unit such as transparent glass to a pixel array unit is applicable. Note that the display module may be provided with a circuit unit for inputting and outputting signals and the between the pixel array unit and the outside, a flexible printed circuit (FPC), or the like. Hereinafter, a digital still camera and a head mounted display will be exemplified as specific examples of the electronic device using the display device of the present disclosure. However, the specific examples exemplified here are merely examples, and the present disclosure is not limited thereto.

SPECIFIC EXAMPLE 1

Figure 25A:
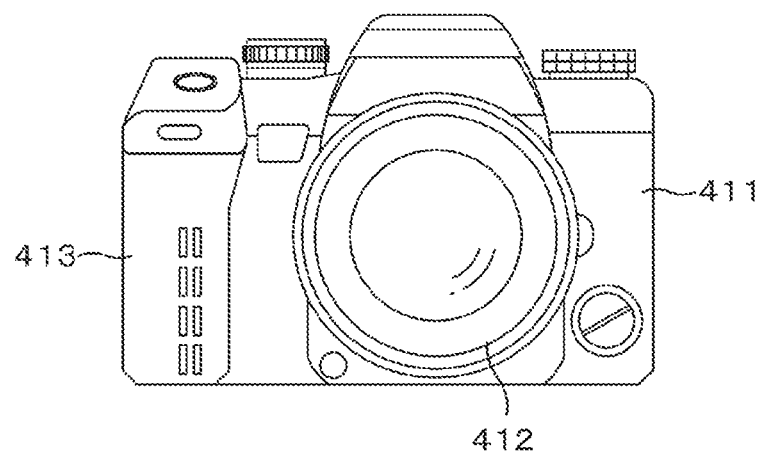
FIG. 25A illustrates a front view thereof and FIG. 25B illustrates a rear view thereof.
Figure 25B:
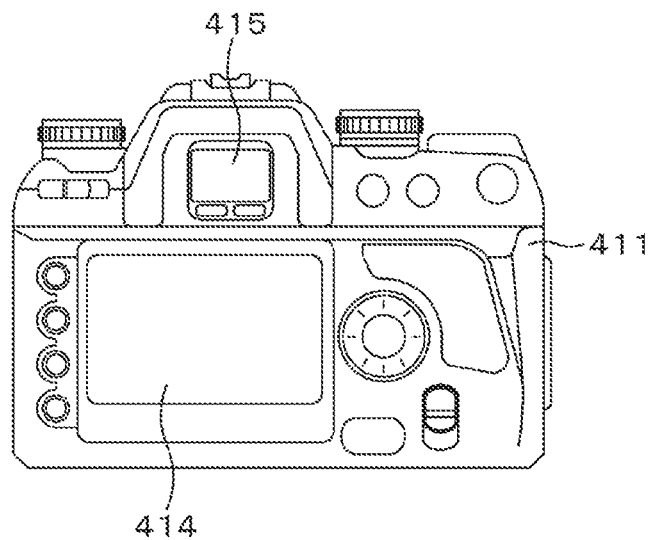

FIG. 25 is an external view of a lens interchangeable single-lens reflex type digital still camera, and FIG. 25A illustrates a front view thereof and FIG. 25B illustrates a rear view thereof. The lens interchangeable single-lens reflex type digital still camera includes, for example, an interchangeable imaging lens unit (interchangeable lens) 412 on a front-right side of a camera body portion (camera body) 411, and a grip portion 413 to be held by a photographer on a front-left side thereof.

In addition, a monitor 414 is provided substantially at the center on a rear side of the camera body portion 411. A viewfinder (eyepiece window) 415 is provided above the monitor 414. By looking into the viewfinder 415, the photographer can visually recognize an optical image of a subject taken from the imaging lens unit 412 and determine a composition.

In the lens interchangeable single-lens reflex type digital still camera having the above-described configuration, the display device of the present disclosure can be used as the viewfinder 415. That is, the lens interchangeable single-lens reflex type digital still camera according to the present example is manufactured by using the display device of the present disclosure as the viewfinder 415.

SPECIFIC EXAMPLE 2

FIG. 26 is an external view of a head mounted display. The head mounted display includes ear-hung portions 512, for example, on both sides of an eyeglasses-type display unit 511, to be worn on a user head. In the head mounted display, the display device of the present disclosure can be used as the display unit 511. That is, the head mounted display according to the present example is manufactured by using the display device of the present disclosure as the display unit 511.

SPECIFIC EXAMPLE 3

Figure 27:
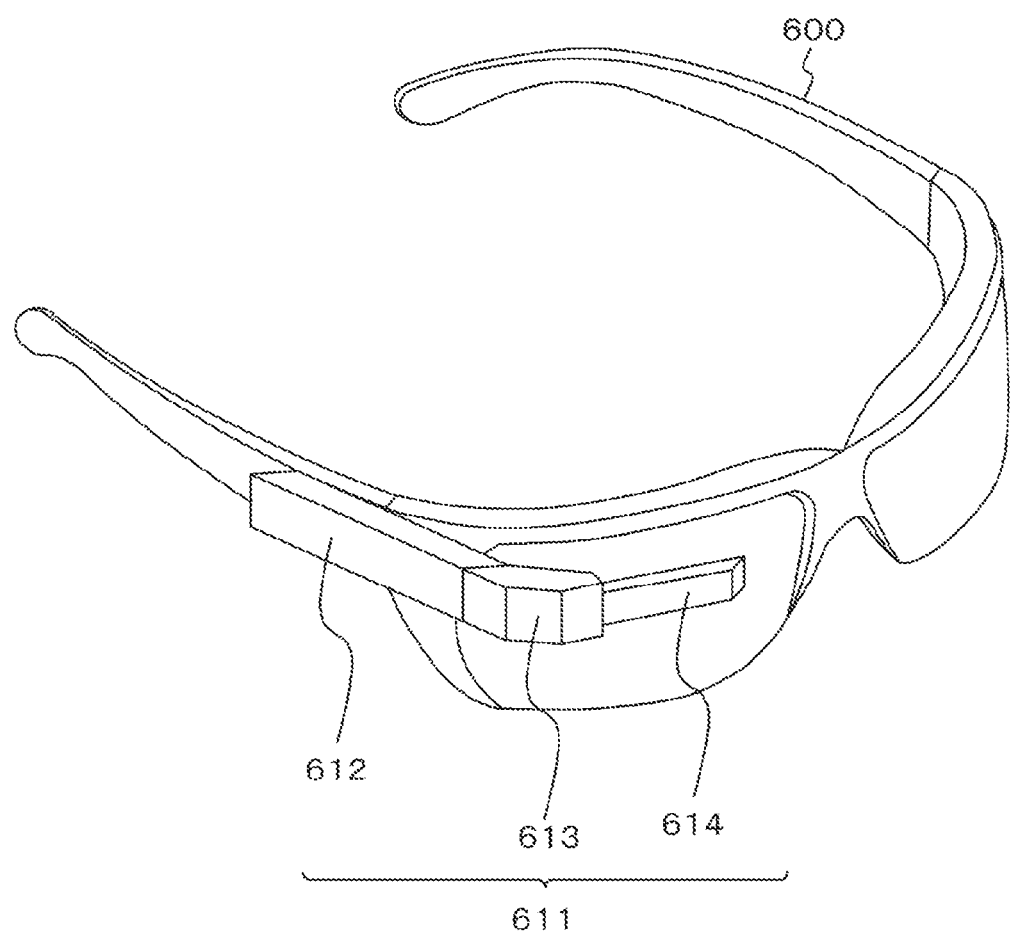
FIG. 27 is an external view of a see-through head mounted display.

FIG. 27 is an external view of a see-through head mounted display. The see-through head mounted display 611 includes a body portion 612, an arm 633, and a lens barrel 614.

The body portion 612 is connected to the arm 613 and eyeglasses 600. Specifically, an end of the body portion 612 in a long-side direction is coupled to the arm 613, and one lateral side of the body portion 612 is connected to the eyeglasses 600 via a connecting member. Note that the body portion 612 may be mounted directly on a human body's head.

The body portion 612 includes a control board for controlling an operation of the see-through head mounted display 611 and a display unit. The arm 613 connects the body portion 612 and the lens barrel 614 to each other and supports the lens barrel 614. Specifically, the arm 613 is coupled to an end of the body portion 612 and an end of the lens barrel 614 to fix the lens barrel 614. Furthermore, the arm 613 includes a signal line for communicating data related to an image provided from the body portion 612 to the lens barrel 614.

The lens barrel 614 projects image light provided from the body portion 612 via the arm 613 toward eyes of a user wearing the see-through head mounted display 611 through an eyepiece. In the see-through head mounted display 611, the display device of the present disclosure can be used for a display unit of the body portion 612.

APPLICATION EXAMPLE

The technology according to the present disclosure can be applied to various products. For example, the technology according to the present disclosure may be realized as a device mounted on any type of mobile body, such as an automobile, and electric vehicle, a hybrid electric vehicle, a motorcycle, a bicycle, a personal mobility, an airplane, a drone, a ship, a robot, a construction machine, or an agricultural machine (tractor).

Figure 28:
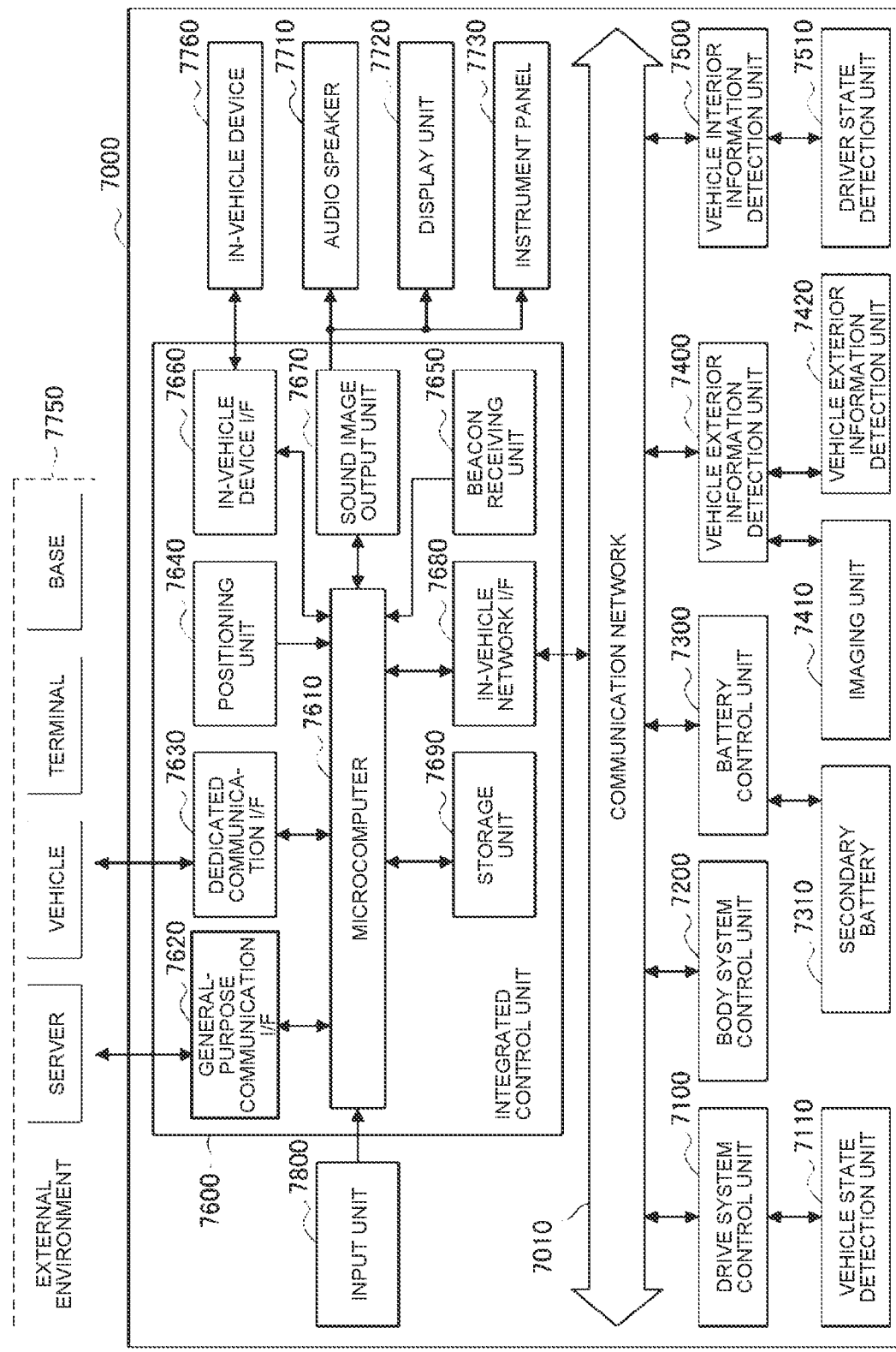
FIG. 28 is a block diagram illustrating an example of a schematic configuration of a vehicle control system.

FIG. 28 is a block diagram illustrating a schematic configuration example of a vehicle control system 7000 as an example of a moving body control system to which the technology according to the present disclosure can be applied. The vehicle control system 7000 includes a plurality of electronic control units connected to each other via a communication network 7010. In the example illustrated in FIG. 28, the vehicle control system 7000 includes a drive system control unit 7100, a body system control unit 7200, a battery control unit 7300, a vehicle exterior information detection unit 7400, a vehicle interior information detection unit 7500, and an integrated control unit 7600. The communication network 7010 connecting the plurality of control units to each other may be, for example, an in-vehicle communication network conforming to an arbitrary standard, such as a controller area network (CAN), a local interconnect network (LIN), a local area network (LAN), or FlexRay (registered trademark).

Each control unit includes a microcomputer performing arithmetic processing according to various programs, a storage unit storing the programs to be executed by the microcomputer, parameters to be used for various calculations, or the like, and a drive circuit driving various devices to be controlled. Each control unit includes a network I/F for communicating with other control units via the communication network 7010, and a communication I/F for communicating with devices, sensors, or the like inside and outside the vehicle by wired communication or wireless communications. In FIG. 28, as a functional configuration of the integrated control unit 7600, a microcomputer 7610, a general-purpose communication I/F 7620, a dedicated communication I/F 7630, a positioning unit 7640, a beacon receiving unit 7650, an in-vehicle device I/F 7660, a sound image output unit 7670, an in-vehicle network I/F 7680, and a storage unit 7690 are illustrated. Similarly, each of the other control units includes a microcomputer, a communication IF, a storage unit, and the like.

The drive system control unit 7100 controls operations of devices related to a drive system of the vehicle according to various programs. For example, the drive system control unit 7100 functions as a device for controlling a driving force generation device for generating a driving force of the vehicle such as an internal combustion engine or a driving motor, a driving force transmission mechanism for transmitting the driving force to wheels, a steering mechanism adjusting a steering angle of the vehicle, a braking device generating a braking force of the vehicle, and the like. The drive system control unit 7100 may have a function as a device for controlling an antilock brake system (ABS), an electronic stability control (ESC), or the like.

A vehicle state detection unit 7110 is connected to the drive system control unit 7100. The vehicle state detection unit 7110 includes at least one of, for example, a gyro sensor detecting an angular velocity of axial rotational motion of a vehicle body, an acceleration sensor detecting an acceleration of the vehicle, and a sensor for detecting an operation amount of an accelerator pedal, an operation amount of a brake pedal, a steering angle of a steering wheel, an engine speed, a wheel rotation speed, or the like. The drive system control unit 7100 performs arithmetic processing using a signal input from the vehicle state detection unit 7110 to control the internal combustion engine, the driving motor, the electric power steering device, the braking device, or the like.

The body system control unit 7200 controls operations of various devices mounted on the vehicle body according to various programs. For example, the body system control unit 7200 functions as a device for controlling a keyless entry system, a smart key system, a power window device, or various lamps such as a head lamp, a back lamp, a brake lamp, a blinker, and a fog lamp. In this case, radio waves transmitted from a portable device substituting for a key or signals of various switches can be input to the body system control unit 7200. The body system control unit 7200 receives the radio waves or signals to control the door lock device, the power window device, the lamps, or the like of the vehicle.

The battery control unit 7300 controls a secondary battery 7310, which is a power supply source of the driving motor, according to various programs. For example, information such as a battery temperature, a battery output voltage, or a battery remaining capacity is input to the battery control unit 7300 from a battery device including the secondary battery 7310. The battery control unit 7300 performs arithmetic processing using these signals to control temperature adjustment of the secondary battery 7310 or control a cooling device or the like included in the battery device.

The vehicle exterior information detection unit 7400 detects information outside the vehicle on which the vehicle control system 7000 is mounted. For example, at least one of an imaging unit 7410 and a vehicle exterior information detection unit 7420 is connected to the vehicle exterior information detection unit 7400. The imaging unit 7410 includes at least one of a time-of-flight (ToF) camera, a stereo camera, a monocular camera, an infrared camera, or other kinds of cameras. The vehicle exterior information detection unit 7420 includes at least one of, for example, an environment sensor for detecting current weather or air condition and a surrounding information detection sensor for detecting another vehicle, an obstacle, a pedestrian, or the like around the vehicle on which the vehicle control system 7000 is mounted.

The environment sensor may be at least one of, for example, a raindrop sensor detecting rainy weather, a fog sensor detecting fog, a sunshine sensor detecting a degree of sunshine, and a snow sensor detecting snowfall. The surrounding information detection sensor may be at least one of an ultrasonic sensor, a radar device, and a light detection and ranging or laser imaging detection and ranging (LIDAR)

device. The imaging unit 7410 and the vehicle exterior information detection unit 7420 may be provided as sensors or devices that are independent from each other, or may be provided as an apparatus in which a plurality of sensors or devices are integrated.

Figure 29:
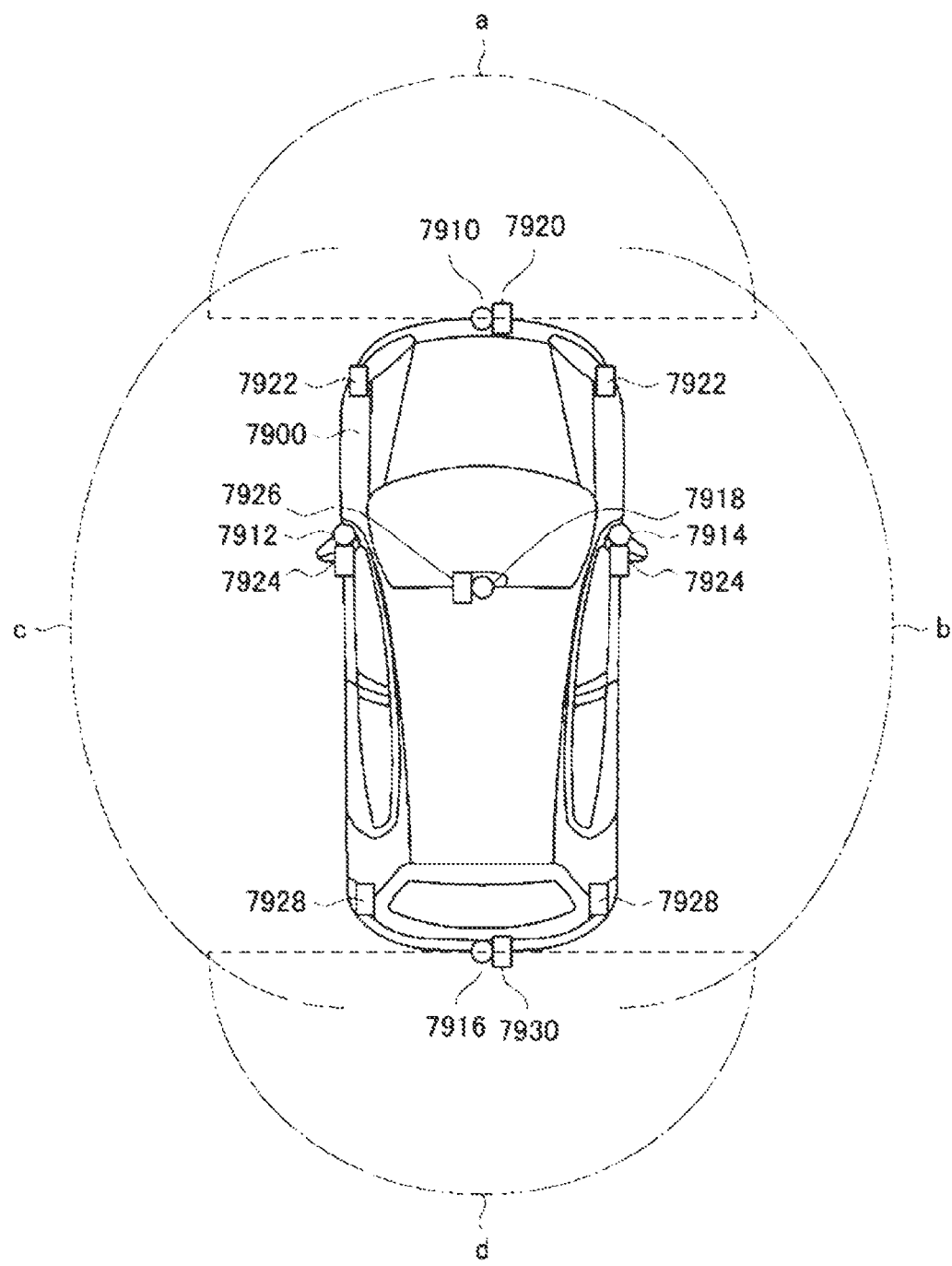
FIG. 29 illustrates examples of positions at which a vehicle exterior information detection unit and an imaging unit are installed.

Here, FIG. 29 illustrates examples of positions at which the imaging unit 7410 and the vehicle exterior information detection unit 7420 are installed Imaging units 7910, 7912, 7914, 7916, and 7918 are provided at least one of, for example, a front nose, a side mirror, a rear bumper, a back door, and an upper portion of a windshield in a vehicle interior of a vehicle 7900. The imaging unit 7910 provided at the from, nose and the imaging unit 7918 provided at the upper portion of the windshield in the vehicle interior mainly acquire images in front of the vehicle 7900. The imaging units 7912 and 7914 provided at the side mirrors mainly acquire images around the sides of the vehicle 7900. The imaging unit 7916 provided at the rear bumper or the back door mainly acquires images behind the vehicle 7900. The imaging unit 7918 provided at the upper portion of the windshield the vehicle interior is mainly used to detect a preceding vehicle, a pedestrian, an obstacle, a traffic light, a traffic sign, a lane, or the like.

Note that FIG. 29 illustrates an example of an imaging range of each of the imaging units 7910, 7912, 7914, and 7916. An imaging range a indicates an imaging range of the imaging unit 7910 provided at the front nose, imaging ranges b and c indicate imaging ranges of the imaging units 7912 and 7914 provided at the side mirrors, respectively, and an imaging range d indicates an imaging range of the imaging unit 7916 provided at the rear bumper or the back door. For example, a bird's-eye view image of the vehicle 7900 as viewed from above is obtained by superimposing image data captured by the imaging units 7910, 7912, 7914, and 7916.

Vehicle exterior information detection units 7920, 7922, 7924, 7926, 7928, and 7930 provided at the front, the rear, the sides, the corners, and the upper portion of the windshield in the vehicle interior of the vehicle 7900 may be, for example, ultrasonic sensors or radar devices. The vehicle exterior information detection units 7920, 7926, and 7930 provided at the front nose, the rear bumper, the back door, and the upper portion of the windshield in the vehicle interior of the vehicle 7900 may be, for example, LIDAR devices. These vehicle exterior information detection units 7920 to 7930 are mainly used to detect a preceding vehicle, a pedestrian, an obstacle, or the like.

Returning to FIG. 28, the description will be continued. The vehicle exterior information detection unit 7400 causes the imaging unit 7410 to capture images outside the vehicle, and receives the captured image data. In addition, the vehicle exterior information detection unit 7400 receives detection information from the vehicle exterior information detection unit 7420 connected thereto. In a case where the vehicle exterior information detection unit 7420 is an ultrasonic sensor, a radar device, or a LIDAR device, the vehicle exterior information detection unit 7400 transmits ultrasonic waves, electromagnetic waves, or the like, and receives information of received reflected waves. The vehicle exterior information detection unit 7400 may perform object detection processing or distance detection processing with respect to a person, a vehicle, an obstacle, a sign, a character on a road surface, or the like on the basis of the received information. The vehicle exterior information detection unit 7400 may perform environment recognition processing for recognizing rainfall, fog, road surface conditions, or the like on the basis of the received information. The vehicle exterior information detection unit 7400 may calculate a distance to an object outside the vehicle on the basis of the received information.

In addition, the vehicle exterior information detection unit 7400 may perform image recognition processing or distance detection processing for recognizing a person, a car, an obstacle, a sign, a character on a road surface, or the like on the basis of the received image data. The vehicle exterior information detection unit 7400 may perform processing such as distortion correction or alignment with respect to the received image data, and combine image data captured by different imaging units 7410 to generate a bird's-eye view image or a panoramic image. The vehicle exterior information detection unit 7400 may perform viewpoint conversion processing using the image data captured by the different imaging units 7410.

The vehicle interior information detection unit 7500 detects information inside the vehicle. For example, a driver state detection unit 7510 detecting a drivers state is connected to the vehicle interior information detection unit 7500. The driver state detection unit 7510 may include a camera imaging the driver, a biological sensor detecting biological information of the driver, a microphone collecting sound in the vehicle interior, or the like. The biological sensor is provided, for example, at a seat surface, a steering wheel, or the like, and detects biological information of an occupant sitting on a seat or a driver holding the steering wheel. On the basis of the detection information input from the driver state detection unit 7510, the vehicle interior information detection unit 7500 may calculate a degree of fatigue or a degree of concentration of the driver or may determine whether or not the driver is dozing off. The vehicle interior information detection unit 7500 may perform processing such as noise canceling processing on the collected sound signal.

The integrated control unit 7600 controls an overall operation in the vehicle control system 7000 according to various programs. An input unit 7800 is connected to the integrated control unit 7600. The input unit 7800 is realized by, for example, a device that can be operated by an occupant for input, such as a touch panel, a button, a microphone, a switch, or a lever. Data obtained by performing sound recognition on the sound input by the microphone may be input to the integrated control unit 7600. The input unit 7800 may be, for example, a remote control device using infrared rays or other radio waves, or an external connection device corresponding to the operation of the vehicle control system 7000, such as a mobile phone or a personal digital assistant (PDA). The input unit 7800 may be, for example, a camera. In this case, an occupant can input information by gesture. Alternatively, data obtained by detecting a movement of a wearable device worn by an occupant may be input. Further, the input unit 7800 may include, for example, an input control circuit or the like generating an input signal on the basis of information input by an occupant or the like using the input unit 7800 and outputting the input signal to the integrated control unit 7600. By operating the input unit 7800, the occupant or the like inputs various kinds of data or give processing operation instructions to the vehicle control system 7000.

The storage unit 7690 may include a read only memory (ROM) storing various programs to be executed by the microcomputer, and a random access memory (RAM) storing various parameters, calculation results, sensor values, and the like. In addition, the storage unit 7690 may be realized by a magnetic storage device such as a hard disc drive (HDD), a semiconductor storage device, an optical storage device, a magneto-optical storage device, or the like.

The general-purpose communication I/F 7620 is a general-purpose communication I/F mediating communication with various devices existing in an external environment 7750. The general-purpose communication I/F 7620 may implement a cellular communication protocol, such as global system of mobile communications (GSM) (registered trademark), WiMAX, long term evolution (LTE), or LTE-advanced (LTE-A), or another wireless communication protocol, such as wireless LAN (also referred to as Wi-Fi (registered trademark)) or Bluetooth (registered trademark). The general-purpose communication I/F 7620 may be connected to a device (for example, an application server or a control server) existing on an external network (for example, the Internet, a cloud network, or a company-specific network), for example, via a base station or an access point. Furthermore, the general-purpose communication I/F 7620 may be connected to a terminal (for example, a terminal of a driver, a pedestrian, or a store, or a machine type communication (MTC) terminal) existing in the vicinity of the vehicle, for example, using a peer-to-peer (P2P) technology.

The dedicated communication I/F 7630 is a communication I/F supporting a communication protocol formulated for use in a vehicle. The dedicated communication I/F 7630 may implement, for example, a standard protocol such as wireless access in vehicle environment (WAVE), which is a combination of IEEE802.11p as a lower layer and IEEE1609 as an upper layer, dedicated short range communications (DSRC), or a cellular communication protocol. The dedicated communication I/F 7630 typically performs V2X communication, which is a concept including one or more of vehicle-to-vehicle communication, vehicle-to-infrastructure communication, vehicle-to-home communication, and vehicle-to-pedestrian communication.

The positioning unit 7640 receives, for example, a global navigation satellite system (GNSS) signal from a GNSS satellite (for example, a global positioning system (GPS) signal from a GPS satellite), executes positioning, and generates position information including a latitude, a longitude, and an altitude of a vehicle. Note that the positioning unit 7640 may specify a current position by exchanging signals with a wireless access point, or may acquire position information from a terminal having a positioning function, such as a mobile phone, a PHS, or a smartphone.

The beacon receiving unit 7650 receives radio waves or electromagnetic waves transmitted, for example, from a wireless station or the like installed on a road, to acquire information such as a car rent position, a traffic jam, a closed road, a required time, or the like. Note that the function of the beacon receiving unit 7650 may be included in the dedicated communication I/F 7630 described above.

The in-vehicle device I/F 7660 is a communication interface mediating connection between the microcomputer 7610 and various in-vehicle devices 7760 existing in the vehicle. The in-vehicle device I/F 7660 may establish wireless connection using a wireless communication protocol such as wireless LAN, Bluetooth (registered trademark), near field communication (NFC), or wireless USB (WUSB). Furthermore, the in-vehicle device I/F 7660 may establish wired connection, such as universal serial bus (USB), high-definition multimedia interface (HDMI) (registered trademark), or mobile high-definition link (MHL), via a connection terminal that is not illustrated (and, if necessary, a cable). The in-vehicle devices 7760 may include at least one of, for example, a mobile device or a wearable device possessed by an occupant and an information device carried into or attached to the vehicle. Furthermore, the in-vehicle devices 7760 may include a navigation device searching for a route to an arbitrary destination. The in-vehicle device I/F 7660 exchanges control signals or data signals with the in-vehicle devices 7760.

The in-vehicle network I/F 7680 is an interface mediating communication between the microcomputer 7610 and the communication network 7010. The in-vehicle network I/F 7680 transmits and receives signals and the like in accordance with a predetermined protocol supported by the communication network 7010.

The microcomputer 7610 of the integrated control unit 7600 controls the vehicle control system 7000 according to various programs on the basis of information acquired via at least one of the general-purpose communication I/F 7620, the dedicated communication I/F 7630, the positioning unit 7640, the beacon receiving unit 7650, the in-vehicle device I/F 7660, and the in-vehicle network I/F 7680. For example, the microcomputer 7610 may calculate a control target value of the driving force generation device, the steering mechanism, or the braking device on the basis of the acquired information inside and outside the vehicle, and output a control command to the drive system control unit 7100. For example, the microcomputer 7610 may perform cooperative control for the purpose of realizing functions of an advanced driver assistance system (ADAS) including collision avoidance or impact mitigation of the vehicle, follow-up traveling based on a distance between vehicles, constant-speed vehicle traveling, warning of vehicle collision, warning of vehicle lane departure, and the like. Furthermore, the microcomputer 7610 may perform cooperative control for the purpose of automatic driving to autonomously travel or the like, rather than depending on a drivers operation, by controlling the driving force generation device, the steering mechanism, the braking device, or the like on the basis of the acquired information around the vehicle.

On the basis of the information acquired via at least one of the general-purpose communication I/F 7620, the dedicated communication I/F 7630, the positioning unit 7640, the beacon receiving unit 7650, the in-vehicle device I/F 7660, and the in-vehicle network I/F 7680, the microcomputer 7610 may generate three-dimensional distance information between the vehicle and an object such as a surrounding structure or a person, and create local map information including surrounding information at a current position of the vehicle. Furthermore, the microcomputer 7610 may predict danger such as collision of the vehicle, approach of a pedestrian or the like, or entry into a closed road, on the basis of the acquired information, and generate a warning signal. The warning signal may be, for example, a signal for generating a warning sound or turning on a warning lamp.

The sound image output unit 7670 transmits an output signal of at least one of a sound and an image to an output device capable of visually or acoustically notifying an occupant of the vehicle or the outside of the vehicle of information. In the example of FIG. 28, an audio speaker 7710, a display unit 7720, and an instrument panel 7730 are illustrated as output devices. The display unit 7720 may include at least one of, for example, an on-board display and a head-up display. The display unit 7720 may have an augmented reality (AR) display function. The output device may be a device other than these devices, such as a head-phone, a wearable device to be worn by an occupant, e.g. an eyeglasses-type display, a projector, or a lamp. In a case where the output device is a display device, the display device visually displays results obtained by various kinds of processing performed by the microcomputer 7610 or information received from the other control units in various formats such as text, images, tables, and graphs. In a case where the output device is a sound output device, the sound output device converts an audio signal including reproduced sound data, acoustic data, or the like into an analog signal and acoustically outputs the analog signal.

Note that at least two control units connected to each other via the communication network 7010 in the example illustrated in FIG. 28 may be integrated as one control unit. Alternatively, each control unit may include a plurality of control units. Further, the vehicle control system 7000 may include another control unit which is not illustrated. In the above description, some or all of the functions of one of the control units may be executed by another one of the control units. That is, as long as information is transmitted and received via the communication network 7010, predetermined arithmetic processing may be performed by any one of the control units. Similarly, a sensor or a device connected to one of the control units may also be connected to another one of the control units, and the plurality of control units may transmit and receive detection information to and from each other via the communication network 7010.

The technology according to the present disclosure can be applied to, for example, the display unit of the output device capable of visually or acoustically notifying information among the above-described configurations.

Configuration of Present Disclosure

Note that the technology of the present disclosure can also have the following configurations.

[A1]
A display device comprising:
lower electrodes formed to be arrayed in a two-dimensional matrix form on a substrate;
partition walls each provided between adjacent ones of the lower electrodes and having a cross section whose width is smaller as being farther away from the substrate;
an organic layer formed by stacking a plurality of material layers on an entire surface including upper surfaces of the lower electrodes and upper surfaces of the partition walls; and
an upper electrode formed on an entire surface including an upper surface of the organic layer,
wherein in pixels each including a light emitting unit in which the lower electrodes, the organic layer, and the upper electrode are stacked,
light in a predetermined band is extracted to the outside by a resonator structure formed between the lower electrode and the upper electrode, and
light in a band different from the predetermined band is extracted to the outside by total reflection at an interface between the organic layer and the partition wall.

[A2]
The display device according to [A1], wherein the upper electrode is formed by stacking a semi-transmissive electrode and a transmissive electrode.

[A3]
The display device according to [A2], wherein a film thickness ratio of the semi-transmissive electrode in the upper electrode is relatively lower in a portion located above an inclined surface of the partition wall than in a portion located above the lower electrode.

[A4]
The display device according to [A2] or [A3], wherein the semi-transmissive electrode is made of a magnesium-silver alloy (MgAg), silver (Ag), or calcium (Ca).

[A5]
The display device according to any one of [A2] to [A4], wherein the transmissive electrode is made of indium zinc oxide (IZO) or indium tin oxide (ITO).

[A6]
The display device according to any one of [A2] to [A5], wherein the semi-transmissive electrode is formed by a vapor deposition method, and the transmissive electrode is formed by a sputtering method.

[A7]
The display device according to any one of [A1] to [A6], wherein the organic layer includes a plurality of light emitting layers emitting different-color light from each other.

[A8]
The display device according to [A7], wherein the organic layer includes a red light emitting layer, a blue light emitting layer, and a green light emitting layer.

[A9]
The display device according to [A8], wherein a light emission separation layer is disposed between the red light emitting layer and the blue light emitting layer.

[A10]
The display device according to [A9], wherein a film thickness ratio of the light emission separation layer in the organic layer is relatively lower in a portion located above an inclined surface of the partition wall than in a portion located above the lower electrode.

[A11]
The display device according to [A7], wherein the organic layer includes a blue light emitting layer and a yellow light emitting layer.

[A12]
The display device according to any one of [A1] to [A11], wherein an inclined surface of the partition wall is formed in a stepwise manner to be gently inclined on a lower electrode side thereof.

[A13]
The display device according to any one of [A1] to [A12], wherein color filters corresponding to colors to be displayed are disposed on upper surfaces of the pixels, respectively.

[A14]
The display device according to [A13], wherein as shapes of light emitting regions of the pixels observed through the color filters, a circular shape and an annular shape are mixed.

[A15]
The display device according to any one of [A1] to [A14], wherein in the resonator structure formed between the lower electrode and the upper electrode, when a phase shift of reflected light generated between the lower electrode and the upper electrode is denoted by reference sign Φ, an optical distance between the lower electrode and the upper electrode is denoted by reference sign L, and a center wavelength of a predetermined band is denoted by reference sign λ, the optical distance L satisfies the following condition:

$$2L/\lambda + \Phi/2\pi = m \text{ where, } m \text{ is an integer.}$$

[A16]
The display device according to any one of [A1] to [A15], wherein light in a band having a blue light wavelength as a center wavelength is extracted to the outside by the resonator structure formed between the lower electrode and the upper electrode.

[A17]

The display device according to [A16], wherein yellow light is extracted to the outside by the total reflection at the interface between the organic layer and the partition wall.

[A18]

The display device according to any one of [A1] to [A15], wherein light in a band having an intermediate wavelength between a blue light wavelength and a green light wavelength as a center wavelength is extracted to the outside by the resonator structure formed between the lower electrode and the upper electrode.

[A19]

The display device according to [A18], wherein red light is extracted to the outside by the total reflection at the interface between the organic layer and the partition wall.

[B1]

An electronic device comprising a display device, wherein the display device includes:
  lower electrodes formed to be arrayed in a two-dimensional matrix form on a substrate;
  partition walls each provided between adjacent ones of the lower electrodes and having a cross section whose width is smaller as being farther away from the substrate;
  an organic layer formed by stacking a plurality of material layers on an entire surface including upper surfaces of the lower electrodes and upper surfaces of the partition walls; and
  an upper electrode formed on an entire surface including an upper surface of the organic layer,
  in pixels each including a light emitting unit in which the lower electrodes, the organic layer, and the upper electrode are stacked,
  light in a predetermined band is extracted to the outside by a resonator structure formed between the lower electrode and the upper electrode, and
  light in a band different from the predetermined band is extracted to the outside by total reflection at an interface between the organic layer and the partition wall.

[B2]

The electronic device according to [B1], in which the upper electrode is formed by stacking a semi-transmissive electrode and a transmissive electrode.

[B3]

The electronic device according to [B2], in which a film thickness ratio of the semi-transmissive electrode in the upper electrode is relatively lower in a portion located above an inclined surface of the partition wall than in a portion located above the lower electrode.

[B4]

The electronic device according to [B2] or [B3], in which the semi-transmissive electrode is made of a magnesium-silver alloy (MgAg), silver (Ag), or calcium (Ca).

[B5]

The electronic device according to any one of [B2] to [B4], in which the transmissive electrode is made of indium zinc oxide (IZO) or indium tin oxide (ITO).

[B6]

The electronic device according to any one of [B2] to [B5], in which the semi-transmissive electrode is formed by a vapor deposition method, and the transmissive electrode is formed by a sputtering method.

[B7]

The electronic device according to any one of [B1] to [B6], in which the organic layer includes a plurality of light emitting layers emitting different-color light from each other.

[B8]

The electronic device according to [B7], in which the organic layer includes a red light emitting layer, a blue light emitting layer, and a green light emitting layer.

[B9]

The electronic device according to [B8], in which a light emission separation layer is disposed between the red light emitting layer and the blue light emitting layer.

[B10]

The electronic device according to [B9], in which a film thickness ratio of the light emission separation layer in the organic layer is relatively lower in a portion located above an inclined surface of the partition wall than in a portion located above the lower electrode.

[B11]

The electronic device according to [B7], in which the organic layer includes a blue light emitting layer and a yellow light emitting layer.

[B12]

The electronic device according to any one of [B1] to [B11], in which an inclined surface of the partition wall is formed in a stepwise manner to be gently inclined on a lower electrode side thereof.

[B13]

The electronic device according to any one of [B1] to [B12], in which color filters corresponding to colors to be displayed are disposed on upper surfaces of the pixels, respectively.

[B14]

The electronic device according to [B13], in which as shapes of light emitting regions of the pixels observed through the color filters, a circular shape and an annular shape are mixed.

[B15]

The electronic device according to any one of [B1] to [B14], in which in the resonator structure formed between the lower electrode and the upper electrode, when a phase shift of reflected light generated between the lower electrode and the upper electrode is denoted by reference sign $\Phi$, an optical distance between the lower electrode and the upper electrode is denoted by reference sign $L$, and a center wavelength of a predetermined band is denoted by reference sign $\lambda$, the optical distance $L$ satisfies the following condition:

$$2L/\lambda + \Phi/2\pi = m \text{ where, } m \text{ is an integer.}$$

[B16]

The electronic device according to any one of [B1] to [B15], in which light in a band having a blue light wavelength as a center wavelength is extracted to the outside by the resonator structure formed between the lower electrode and the upper electrode.

[B17]

The electronic device according to [B16], in which yellow light is extracted to the outside by the total reflection at the interface between the organic layer and the partition wall.

[B18]

The electronic device according to any one of [B1] to [B15], in which light in a band having an intermediate wavelength between a blue light wavelength and a green light wavelength as a center wavelength is extracted to the outside by the resonator structure formed between the lower electrode and the upper electrode.

[B19]

The electronic device according to [B18], in which red light is extracted to the outside by the total reflection at the interface between the organic layer and the partition wall.

REFERENCE SIGNS LIST 1, 2, 3 DISPLAY DEVICE
10 SUBSTRATE
11 GATE ELECTRODE
12 GATE INSULATING FILM
13 SEMICONDUCTOR MATERIAL LAYER
14 PLANARIZING FILM
15 SOURCE/DRAIN ELECTRODE
16 PLANARIZING FILM
17 CONTACT PLUG
21, $21_R$, $21_G$, $21_B$, 321A, 321B, 321C LOWER ELECTRODE (ANODE ELECTRODE)
22, 222, 322 PARTITION WALL
22A MATERIAL LAYER
30, $30_R$, $30_G$, $30_B$, 330 ORGANIC LAYER
31, 331 HOLE INJECTION LAYER
32, 332 HOLE TRANSPORT LAYER
$33_R$, $333_R$ RED LIGHT EMITTING LAYER
$33_G$, $333_G$ GREEN LIGHT EMITTING LAYER
$33_B$, $333_B$ BLUE LIGHT EMITTING LAYER
$33_Y$ YELLOW LIGHT EMITTING LAYER
34, 334 LIGHT EMISSION SEPARATION LAYER
35, 335 ELECTRON TRANSPORT LAYER
36, 336 ELECTRON INJECTION LAYER
37 ELECTRON INJECTION LAYER
38 CHARGE GENERATION LAYER
39 HOLE TRANSPORT LAYER
41 UPPER ELECTRODE (CATHODE ELECTRODE)
41A SEMI-TRANSMISSIVE ELECTRODE
41B TRANSMISSIVE ELECTRODE
42 PROTECTIVE FILM
51 HIGH REFRACTIVE INDEX MATERIAL LAYER
60 COLOR FILTER
$61_R$ RED COLOR FILTER
$61_G$ GREEN COLOR FILTER
$61_B$ BLUE COLOR FILTER
$61_W$ WHITE (TRANSPARENT) COLOR FILTER
70 PIXEL
$70_R$ RED COLOR PIXEL
$70_G$ GREEN COLOR PIXEL
$70_B$ BLUE COLOR PIXEL
$70_W$ WHITE COLOR PIXEL
71, $71_R$, $71_G$, $71_B$ REFLECTION PLATE
$72_R$, $72_G$, $72_B$ OPTICAL ADJUSTMENT LAYER
73 SURFACE OF BASE
$74_R$, $74_G$, $74_B$ OXIDE FILM
80 DISPLAY REGION
100 POWER SUPPLY UNIT
101 SCANNING UNIT
102 DATA DRIVER
411 CAMERA BODY PORTION
412 IMAGING LENS UNIT
413 GRIP PORTION
414 MONITOR
415 VIEWFINDER
511 EYEGLASSES-TYPE DISPLAY UNIT
512 EAR-HUNG PORTION
600 EYEGLASSES (EYEWEAR)
611 SEE-THROUGH HEAD MOUNTED DISPLAY
612 BODY PORTION
613 ARM
614 LENS BARREL

The invention claimed is:

1. A display device comprising:
lower electrodes arrayed in a two-dimensional matrix on a substrate, the lower electrodes including a first lower electrode and a second lower electrode;
a partition wall arranged between the first lower electrode and the second lower electrode, the partition wall having a width that decreases with distance from the substrate in a cross sectional view;
an organic layer formed by stacking a plurality of material layers on upper surfaces of the lower electrodes and an upper surface of the partition wall; and
an upper electrode formed on an upper surface of the organic layer,
wherein the first lower electrode, the organic layer, and the upper electrode are stacked and form a light emitting unit for a pixel; and
a resonator structure formed between the first lower electrode and the upper electrode for the pixel, the resonator structure directing light in a first band to outside the display device, and
wherein light in a second band different from the first band is directed to outside the display device by total reflection at an interface between the organic layer and the partition wall.

2. The display device according to claim 1, wherein the upper electrode is formed by stacking a semi-transmissive electrode and a transmissive electrode.

3. The display device according to claim 2, wherein a film thickness ratio of the semi-transmissive electrode in the upper electrode is relatively lower in a portion located above an inclined surface of the partition wall than in a portion located above the first lower electrode.

4. The display device according to claim 2, wherein the semi-transmissive electrode is made of a magnesium-silver alloy (MgAg), silver (Ag), or calcium (Ca).

5. The display device according to claim 2, wherein the transmissive electrode is made of indium zinc oxide (IZO) or indium tin oxide (ITO).

6. The display device according to claim 2, wherein the semi-transmissive electrode is formed by a vapor deposition method, and the transmissive electrode is formed by a sputtering method.

7. The display device according to claim 1, wherein the organic layer includes a plurality of light emitting layers emitting different-color light from each other.

8. The display device according to claim 7, wherein the organic layer includes a red light emitting layer, a blue light emitting layer, and a green light emitting layer.

9. The display device according to claim 8, wherein a light emission separation layer is disposed between the red light emitting layer and the blue light emitting layer.

10. The display device according to claim 9, wherein a film thickness ratio of the light emission separation layer in the organic layer is relatively lower in a portion located above an inclined surface of the partition wall than in a portion located above the first lower electrode.

11. The display device according to claim 7, wherein the organic layer includes a blue light emitting layer and a yellow light emitting layer.

12. The display device according to claim 1, wherein an inclined surface of the partition wall is formed in a stepwise manner to be gently inclined on a lower electrode side thereof.

13. The display device according to claim 1, wherein the pixel is one of a plurality of pixels, and color filters corresponding to colors to be displayed are disposed on upper surfaces of the pixels, respectively.

14. The display device according to claim 13, wherein as shapes of light emitting regions of the pixels observed through the color filters, a circular shape and an annular shape are mixed.

15. The display device according to claim 1, wherein in the resonator structure formed between the first lower electrode and the upper electrode, when a phase shift of reflected light generated between the first lower electrode and the upper electrode is denoted by reference sign $, an optical distance between the first lower electrode and the upper electrode is denoted by reference sign L, and a center wavelength of a predetermined band is denoted by reference sign λ, the optical distance L satisfies the following condition:

$2L/\lambda + \Phi/2\pi = m$ where, $m$ is an integer.

16. The display device according to claim 1, wherein light in a band having a blue light wavelength as a center wavelength is directed to outside the display device by the resonator structure.

17. The display device according to claim 16, wherein yellow light is directed to outside the display device by the total reflection at the interface between the organic layer and the partition wall.

18. The display device according to claim 1, wherein light in a band having an intermediate wavelength between a blue light wavelength and a green light wavelength as a center wavelength is directed outside the display device by the resonator structure.

19. The display device according to claim 18, wherein red light is directed outside the display device by the total reflection at the interface between the organic layer and the partition wall.

20. An electronic device comprising the display device according to claim 1.

* * * * *